(12) United States Patent
Sakaguchi et al.

(10) Patent No.: US 6,306,729 B1
(45) Date of Patent: Oct. 23, 2001

(54) SEMICONDUCTOR ARTICLE AND METHOD OF MANUFACTURING THE SAME

(75) Inventors: Kiyofumi Sakaguchi, Yokohama; Takao Yonehara, Atsugi, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/219,748

(22) Filed: Dec. 23, 1998

(30) Foreign Application Priority Data

Dec. 26, 1997 (JP) .................................................. 9-361091

(51) Int. Cl.[7] .................................................. H01L 21/76
(52) U.S. Cl. .......................... 438/458; 438/409; 438/413; 438/759; 438/406
(58) Field of Search .................... 438/406, 409, 438/413, 458, 107, 759, 960, 977, 607

(56) References Cited

U.S. PATENT DOCUMENTS

| 5,371,037 | 12/1994 | Yonehara | 437/86 |
| 5,453,394 | * 9/1995 | Yonehara et al. | |
| 5,559,043 | 9/1996 | Bruel | 437/24 |
| 5,856,229 | * 1/1999 | Sakaguchi et al. | |

FOREIGN PATENT DOCUMENTS

| 0 499 488 A2 | * 8/1992 | (EP) . |
| 0 757 377 | 2/1997 | (EP) . |
| 0 767 486 | 4/1997 | (EP) . |
| 0 793 263 | 9/1997 | (EP) . |
| 0 797 258 | 9/1997 | (EP) . |
| 0 843 345 | 5/1998 | (EP) . |
| 5-21338 | 1/1993 | (JP) . |
| 7-302889 | 11/1995 | (JP) . |
| 9-102594 | 4/1997 | (JP) . |

OTHER PUBLICATIONS

Sato et al, "Epitaxial growth onporous Si for a new bond and etchback Silicon–on–Insulator", J. Electrochem. Soc., vol. 142, No. 9, pp. 3116, 3117, 3121, Sep. 1995.*
W.G. Howells, "Polymerblasting with Super–Water from 1974 to 1989: A Review", Int'l J. Water Jet Tech., vol. 1, No. 1, pp. 1–16 (1990).
A VanVeen et al., "Helium–Induced Porous Layer Formation in Silicon", Mat. Res. Soc. Symp. Proc., vol. 107, pp. 449–454 (1988).
A. Uhlir, Jr., "Electrolytic Shaping of Germanium and Silicon", Bell Sys. Tech. J., vol. 35, pp. 333–347 (1956).

* cited by examiner

*Primary Examiner*—George Fourson
*Assistant Examiner*—Joannie Adelle Garcia
(74) *Attorney, Agent, or Firm*—Fitzpatrick, Cella, Harper & Scinto

(57) ABSTRACT

A method of manufacturing a semiconductor article comprises forming a doped layer containing an element capable of controlling the conductivity type at least on one of the surfaces of a semiconductor substrate, modifying the surface of the doped layer into a porous state to obtain a porous layer thinner than the doped layer, forming a non-porous layer on the porous layer to prepare a first article, bonding the first article and a second article so as to produce a multilayer structure having the porous layer in the inside thereof, and separating the multilayer structure along the porous layer.

43 Claims, 7 Drawing Sheets

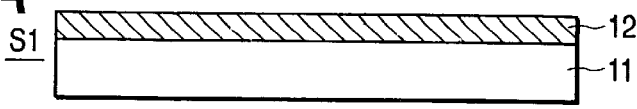
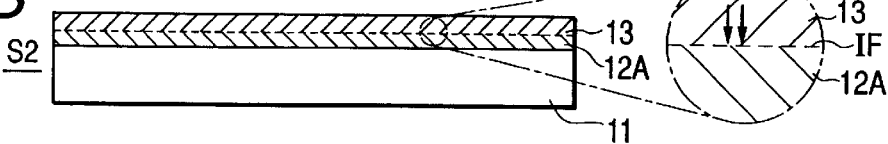
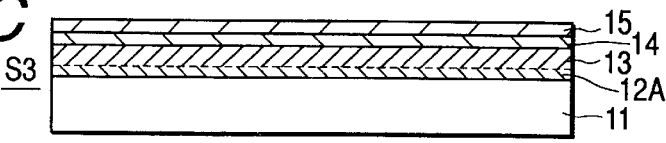
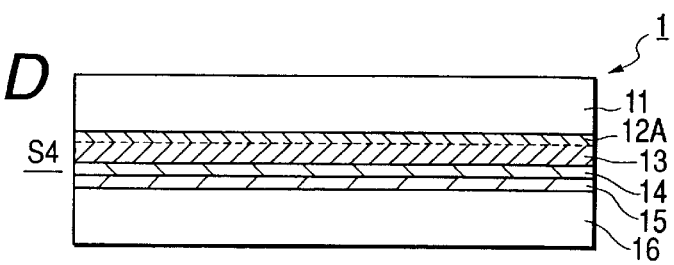
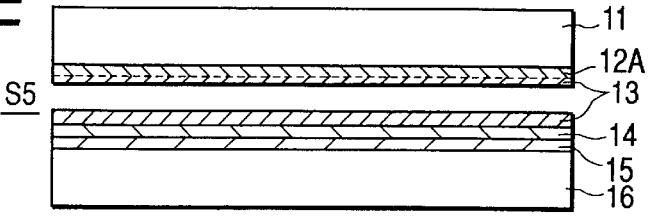
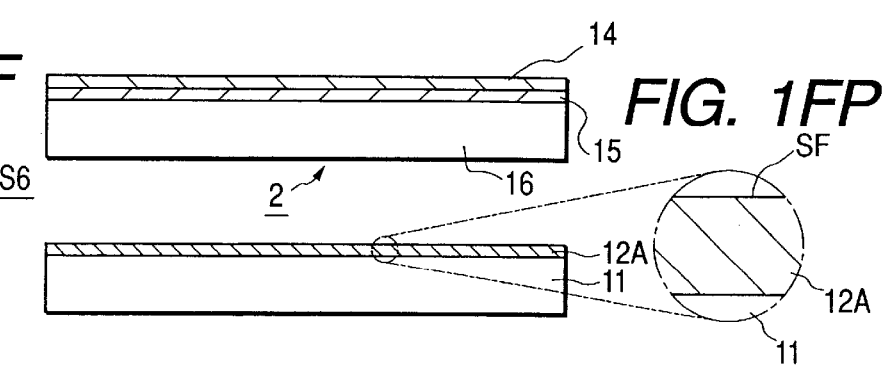

FIG. 2A
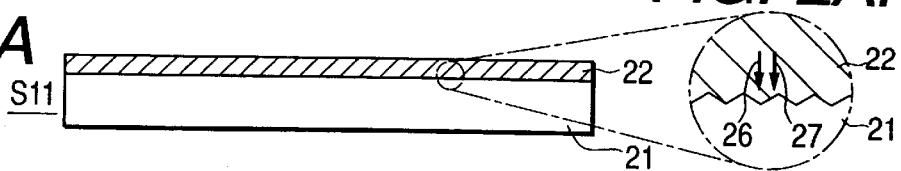
FIG. 2AP
FIG. 2B
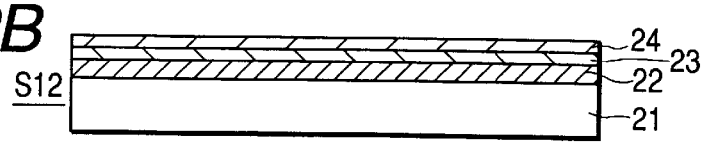
FIG. 2C
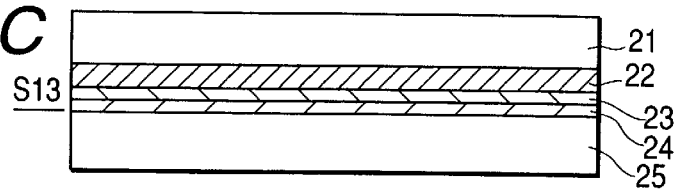
FIG. 2D
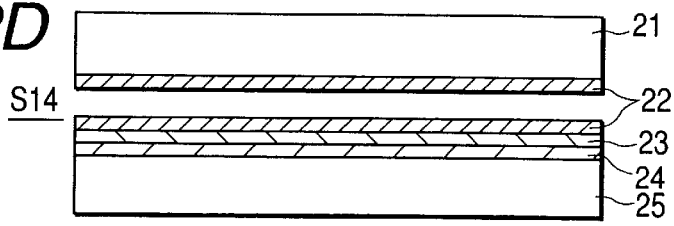
FIG. 2E
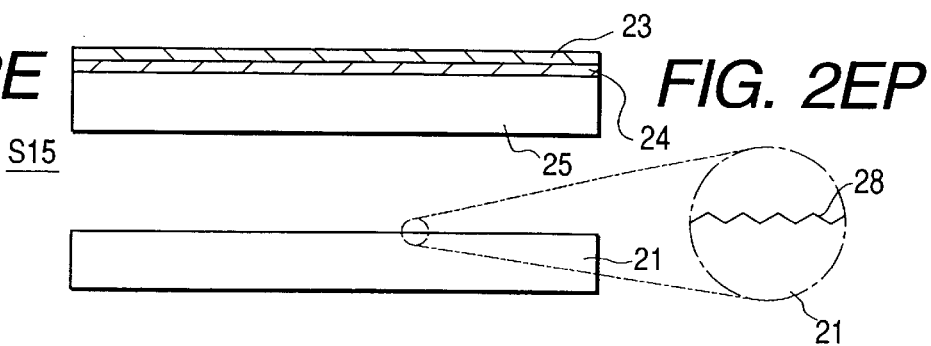
FIG. 2EP

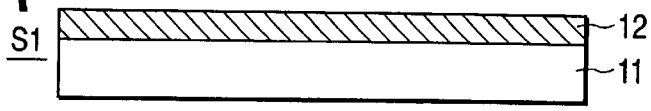
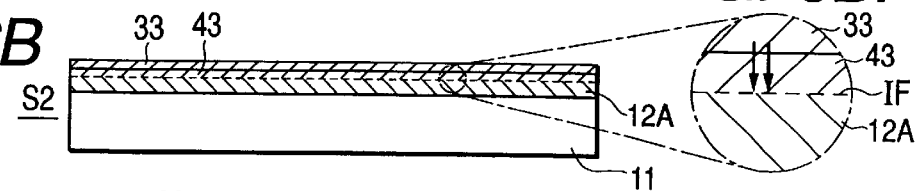
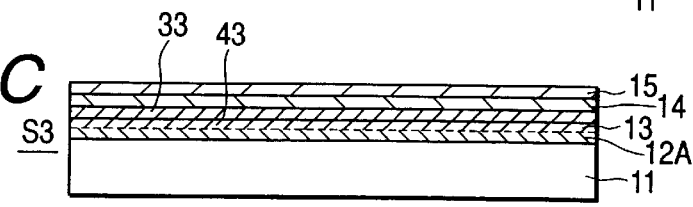
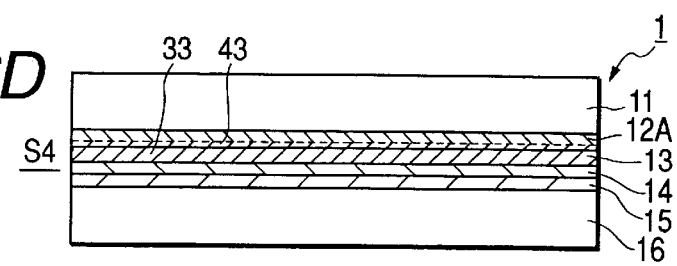
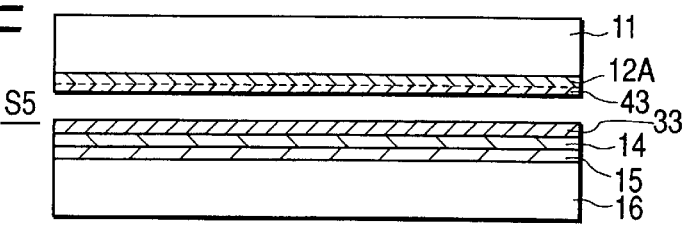
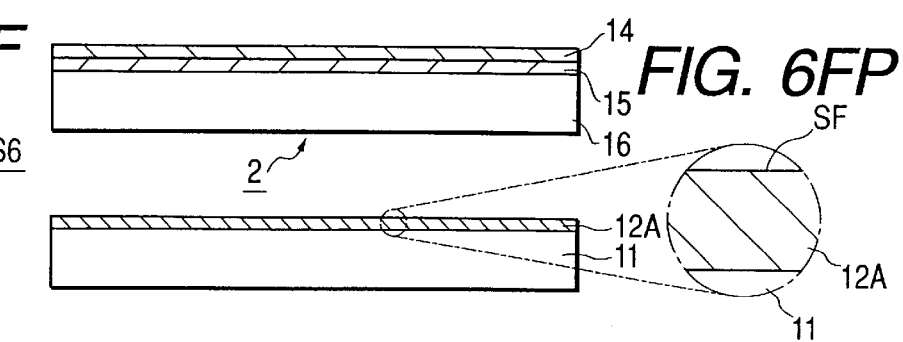

FIG. 7

| | MICRO-REGION | LARGE REGION | CROSS SECTION (SCHEMATIC ILLUSTRATION) |
|---|---|---|---|
| COMP. EXAMPLE | ROOT-MEAN-SQUARE LESS THAN 10nm IN 50 μm SQUARE | UNDULATIONS VISIBLE UNDER FLUORESCENT LIGHT | |
| EXAMPLE 1 | SAME AS ABOVE | VISUALLY MIRROR-SMOOTH | |

FIG. 8

| | MICRO-REGION | LARGE REGION | CROSS SECTION (SCHEMATIC ILLUSTRATION) |
|---|---|---|---|
| COMP. EXAMPLE | ROOT-MEAN-SQUARE LESS THAN 0.2nm IN 50 μm SQUARE | UNDULATIONS VISIBLE UNDER FLUORESCENT LIGHT | |
| EXAMPLE 1 | SAME AS ABOVE | VISUALLY MIRROR-SMOOTH | |

SEMICONDUCTOR ARTICLE AND METHOD OF MANUFACTURING THE SAME

BACKGROUND OF THE INVENTION

1. Field of the Invention

This invention generally relates to a method of manufacturing a semiconductor article to be suitably be used for preparing a semiconductor device, a filter, a light emitting device, a micromechanical or optical part and, more particularly, it relates to a method of manufacturing a semiconductor article comprising a step of separating a multilayer structure having a porous layer into two or more than two parts.

2. Related Background Art

Semiconductor articles refer to semiconductor wafers, semiconductor substrates and other semiconductor members. For the purpose of the present invention, semiconductor articles include those on which one or more than one semiconductor devices are formed or to be formed by utilizing the semiconductor region thereof.

Certain semiconductor articles comprise a semiconductor layer formed on an insulator. Such semiconductor articles will be discussed in greater detail below. The technology of forming a single-crystal Si semiconductor layer on an insulator is known as the semiconductor on insulator (SOI) technology and has been investigated by many researchers because it provides a number of advantages that cannot be obtained by bulk Si substrates that are widely used for preparing ordinary Si integrated circuits. In short, the SOI technology provides advantages of:

(1) easy dielectric separation and feasibility to a high degree of integration;
(2) an excellent radiation resistance;
(3) a reduced floating capacitance and adaptability to high speed operation;
(4) capability of omitting a well step;
(5) prevention of latch-ups; and
(6) capability of producing fully depleted type field effect transistors as a result of realizing a semiconductor thin film.

Meanwhile, Japanese Patent Application Laid-Open No. 5-21338 and U.S. Pat. No. 5,371,037 propose a method of manufacturing a semiconductor article comprising a bonding step as will be described below.

According to the proposed method, a non-single-crystal semiconductor layer is formed on a porous layer and bonded to a support substrate with an insulation layer interposed therebetween and subsequently the porous layer is removed by etching. This method is unique and remarkable in that it provides an excellent uniformity for the film thickness of the SOI layer, a particular easiness for reducing the crystal defect density of the SOI layer, a good surface smoothness of the SOI layer, no need for a particularly specified and hence costly manufacturing apparatus and the capability of manufacturing SOI structures over a wide range of film thickness between several hundred angstroms and 10 microns.

Japanese Patent Application Laid-Open No. 9-102594 proposes a manufacturing method comprising forming a diffusion region by diffusing an element capable of controlling the conductivity into a silicon substrate, forming a porous layer in the diffusion region, forming a non-porous single-crystal layer in the diffusion region, bonding it to a supporting substrate with interposing an insulation layer and subsequently removing the porous layer. This method provides advantages that a relatively inexpensive resistance-non-specified substrate can be employed to reduce the manufacturing cost and that the concentration of the element (specific resistance) on and near the surface can be controlled precisely by the diffusion process. However, with the above proposed methods, a pair of silicon substrates are consumed for producing a single SOI wafer and one of the substrates will be totally lost as a result of grinding, polishing and etching.

Thus, Japanese Patent Application Laid-Open No. 7-302889 proposes a method of manufacturing an SOI wafer without losing a silicon substrate. The proposed method comprises forming a non-porous single-crystal semiconductor layer on a porous layer formed on a first substrate, bonding the non-porous single-crystal semiconductor layer to a second substrate with interposing an insulation layer, separating the first and second substrates along the porous layer without destroying the substrates, smoothing the surface of the first substrate and forming another porous layer on the first substrate for reuse. With this method, the first substrate is separated away without being destroyed so that it can be repeatedly used for the process of manufacturing SOI wafers to significantly reduce the manufacturing cost and simplify the manufacturing process.

However, the inventors of the present invention have found that, unless the first substrate is always separated to show the same contour and same (exposed) surface condition, the processing steps necessary for regenerating the first substrate to make it reusable require certain adjustment.

Additionally, large undulations on the interface of the porous layer and the substrate can limit the reusability of the first substrate.

SUMMARY OF THE INVENTION

It is an object of the present invention to provide a method of manufacturing a semiconductor article at low cost with simplified processing steps necessary for regenerating a first substrate.

Another object of the present invention is to provide a method of manufacturing a semiconductor article adapted to separate a first substrate form a second article reliably and make it shown the same contour and same surface condition after the separation.

Still another object of the present invention is to provide a method of manufacturing a semiconductor article adapted to reduce the undulations on the porous layer/substrate interface of a first substrate after separating it from a second article and make the first substrate reusable regardless of its specific resistance.

According to the invention, the above objects and other objects are achieved by providing a method of manufacturing a semiconductor article comprising steps of forming a doped layer containing an element capable of controlling the conductivity type at least on one of the surfaces of a semiconductor substrate, modifying the surface of the doped layer into a porous state to obtain a porous layer thinner than the doped layer, forming a non-porous layer on the porous layer to prepare a first substrate, bonding said first article and a second article so as to produce a multilayer structure having said porous layer in the inside thereof, and separating said multilayer structure along said porous layer.

According to the invention, there is also provided a semiconductor article comprising a semiconductor substrate, a single-crystal semiconductor layer formed on the semiconductor substrate and a porous layer formed on the single-crystal semiconductor layer;

said single-crystal semiconductor layer being a layer formed by epitaxial growth;

said porous layer comprising a plurality of thin layers having respective porosities different from each other.

BRIEF DESCRIPTION OF THE DRAWINGS

FIGS. 1A, 1B, 1BP, 1C, 1D, 1E, 1F and 1FP are schematic cross-sectional views of an embodiment of a semiconductor article, showing different manufacturing steps of a manufacturing method according to the invention.

FIGS. 2A, 2AP, 2B, 2C, 2D, 2E and 2EP are schematic cross-sectional views of a semiconductor article, showing different manufacturing steps of a comparative manufacturing method.

FIGS. 6A, 6B, 6BP, 6C, 6D, 6E, 6F and 6FP are schematic cross-sectional views of another embodiment of a semiconductor article, showing different manufacturing steps of a manufacturing method according to the invention.

FIGS. 7 and 8 are charts showing some of the results of the evaluation conducted on the semiconductor article obtained by the method of FIGS. 1A to 1F and the article obtained by the comparative method of FIGS. 2A to 2E.

DESCRIPTION OF THE PREFERRED EMBODIMENTS

Figure 3:
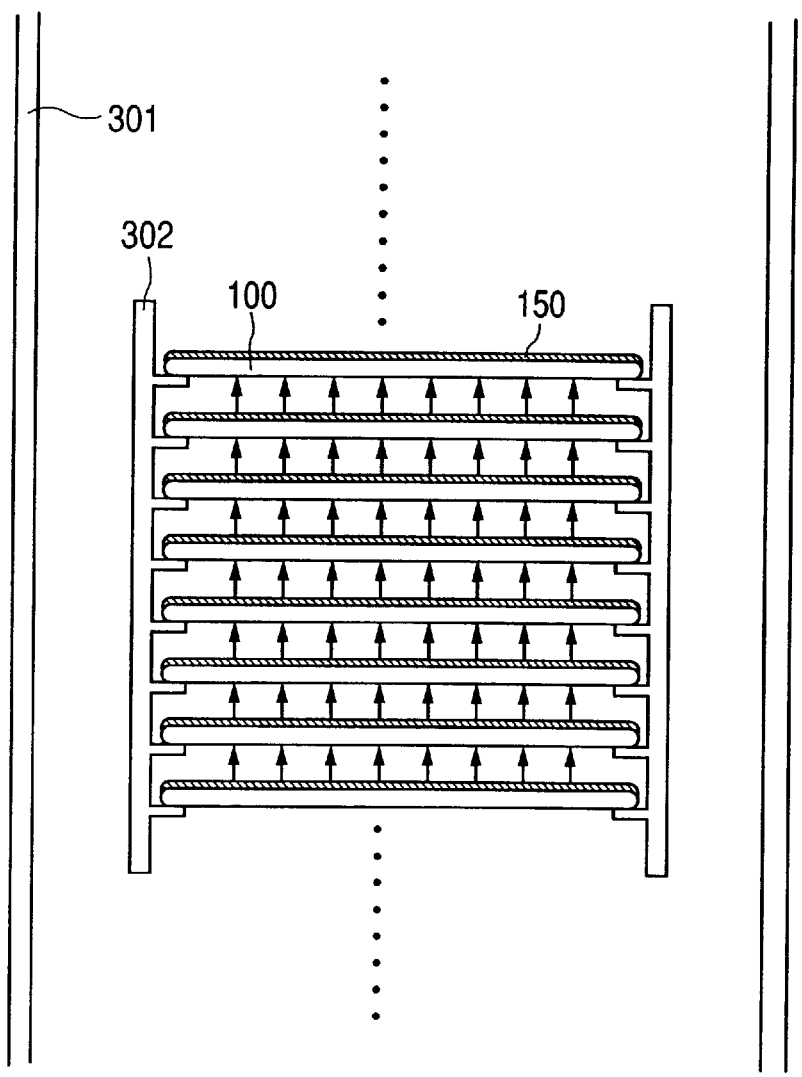
FIG. 3 is a schematic illustration of a diffusion process conducted in a furnace that can be used for the purpose of the present invention.

FIGS. 1A, 1B, 1BP, 1C, 1D, 1E, 1F and 1FP are schematic cross-sectional views of an embodiment of a semiconductor article, showing different manufacturing steps of a manufacturing method according to the invention.

In Step S1, a doped layer 12 is formed on the surface of a prepared semiconductor substrate 11 by adding an element (which may be referred to as dopant hereinafter) capable of controlling the conductivity type (FIG. 1A).

Then, in Step S2, the surface side of the doped layer 12 is modified into a porous state such that the formed porous layer 13 shows a thickness smaller than that of the doped layer 12 and hence a residual doped layer 12A is left under the porous layer 13 (FIGS. 1B, 1BP).

Subsequently, in Step S3, a non-porous layer 14 is formed on the porous layer 13. If necessary, an insulation layer 15 is formed on the non-porous layer 14 (FIG. 1C).

In Step S4, the semiconductor substrate 11 now carrying a non-porous layer 14 (first article) and a separately prepared second article 16 are bonded together. Thus, there is obtained a multilayer structure 1 having a non-porous layer 14 in the inside thereof.

Then, in Step S5, the multilayer structure 1 is separated into two parts along the inside or the interface (the upper or lower surface) of the porous layer 13 (FIG. 1E). In fact, FIG. 1E shows that the multilayer structure 1 is separated in the inside of the porous layer 13 so that both the semiconductor substrate 11 and the second article 16 carry a residue of the porous layer on the respective surfaces produced by the separation.

If necessary, in Step S6, the residual porous layer 13 is removed to produce an SOI substrate 2 and a separated semiconductor substrate 11 each having a flat surface.

The doped layer 12 has a dopant concentration distribution improved in the in-plane uniformity, i.e., uniformity in the horizontal direction in FIGS. 1A to 1F, as compared to the semiconductor substrate before doping (virgin wafer). Therefore, the interface IF between the residual doped layer 12A and the porous layer 13 is highly flat.

Since the interface 1F is flat, a flat surface SF showing a uniform dopant concentration is obtained for the semiconductor substrate 11 after removing the residual porous layer 13.

On the other hand, if the SOI substrate 2 carries the residual porous layer 13 on the non-porous layer 14 after the separation, the residual layer 13 shows a uniform dopant concentration and a highly uniform intra-planar porosity. Then, since the residual porous layer 13 shows a highly uniform thickness, it can be selectively removed without giving rise to a non-uniform film thickness distribution in the non-porous underlayer.

Additionally, due to the fact that the porous layer 13 that operates as separation layer shows a uniform dopant concentration and a highly uniform intra-planar porosity as pointed out above, the separation takes place generally along the same plane to invariably give an intended profile to the semiconductor substrate 11 so that the residual porous layer will show a substantially constant thickness. Thus, the operation of removing the residual porous layer can be conducted under same conditions and hence is adapted to mass production.

Furthermore, the undulations on the porous layer/substrate interface of the first article can be minimized by modifying a surface layer of the doped layer into a porous state to a thickness smaller than the thickness of the doped layer and separating the multilayer structure along this porous layer. This effect will be discussed below in greater detail.

In the process of producing an ingot for a single-crystal wafer, fine variations can appear in the dopant concentration as the solid phase grows along a transversal direction of the ingot. The variations in the concentration may be negligible for the ordinary IC manufacturing process.

With the method of separating the bonded first and second articles along the porous layer formed on the first article and reusing the separated Si substrate as another first article as proposed in Japanese Patent Application Laid-Open No. 7-302889, undulations can be produced on the interface of the porous layer/substrate interface due to the variations in the dopant concentration of the wafer surface as pointed out above. For instance, in the process of anodizing the porous layer on the wafer surface, the current density changes to locally change the film thickness distribution of the porous layer and produce undulations on the porous layer/substrate interface. This phenomenon will be described further by referring to FIGS. 2A through 2E.

In FIG. 2A showing Step S11, 21 denotes a single-crystal substrate and 22 denotes a porous layer. Referring to FIG. 2AP, the dopant concentration differs at positions indicated by arrows 26 and 27 so that the doped layer is modified into a porous layer at a rate that differs at these positions to produce a difference of level there as a result. Then, in Step S12, a single-crystal layer 23 and an oxide layer 24 are formed to complete the process of preparing a first article (FIG. 2B) and, in Step S13, the first article is bonded to a second article 25 (FIG. 2C). Thereafter, in Step S14, the two articles are separated along the porous layer 22 (FIG. 2D) and, in Step S15, the residual porous layer is removed from the second article to produce an SOI substrate (FIG. 2E). On the other hand, after removing the residual porous layer, the first article reveals the undulations 28 existing on the porous layer/substrate interface at intervals of about several hundred μm to 1 mm (FIG. 2EP). In an ingot preparing process using a CZ technique, for example, substantially coaxial undulations will be produced. The undulations 28 will remain if the porous layer is removed by polishing unless the substrate is overpolished after removing the porous layer. The surface of the first article exposed after removing the porous layer not only shows such undulations but also a certain degree of micro-roughness that corresponds to the profiles of the front ends of micro-pores of the porous layer. The micro-roughness can be removed to smooth the surface by a heat treatment process conducted in a hydrogen-containing atmosphere or by a surface touch-polishing process that are not accompanied by a reduction in the film thickness.

However, since the undulations are caused by the variations in the thickness of the porous layer, the first substrate will eventually come to show remarkable undulations that would not allow any further reuse unless it is subjected to a surface planarizing process, although it may be regenerated satisfactorily for the first reuse. Then, the first substrate has to be planarized by polishing at the cost of reducing its height to a certain extent. Thurs, the wafer loses its height by "the thickness of the porous layer and the thickness lost by the polishing". When the wafer has a height under a certain level, it will become short of the required mechanical strength and can be broken during the manufacturing process. The number of times of reusing the wafer will be limited. In other words, both the thickness and the number of times by which the wafer is polished for removing the undulations should be reduced in order to regenerate the wafer for a large number of times. Thus, the wafer can be effectively and efficiently regenerated for a number of times by reducing both the local variations in the dopant concentration on the wafer surface and the undulations on the porous layer/substrate interface.

According to the invention, the undulations on the porous layer/substrate interface is reduced by using a process adapted to uniformizing the intra-planar dopant concentration on the wafer surface by means of an appropriate technique for adding a dopant element capable of controlling the conductivity type such as diffusion, ion implantation or epitaxial growth. Thus, according to the invention, the undulations on the porous layer/substrate interface can be effectively reduced so that the first article can be reused immediately after removing the residual porous layer therefrom or after regenerating it by smoothing the micro-roughness by means of a heat treatment process conducted in a hydrogen-containing atmosphere or a surface touch-polishing process.

For the purpose of the invention, only a surface layer of the first article may be modified into a doped layer showing a high dopant concentration because the crystallinity of the epitaxial layer is highly sensitive to the structure of the porous layer at and near the surface thereon. Since the remaining underlying portion of the wafer is not practically used for the manufacturing process, a relatively inexpensive resistance-non-specified regenerated wafer may be used for the purpose of the invention. A "regenerated wafer" as used herein refers to a wafer obtained by removing the surface layer of a monitor wafer used in an IC process or a wafer carrying a rejected device on the surface by means of etching or grinding and then polishing the surface to a level of smoothness compatible with an IC process. Such a regenerated wafer may show an impurity concentration level and a contamination level same as those of an ordinary wafer.

When a doped layer is formed by means of a diffusion technique, the diffusion of the diffusion layer (e.g., $P^+$ layer) can be carried out both on the front surface and the rear surface simultaneously. This means that both the resistance of the rear surface of the wafer and that of the positive electrode can be lowered for anodization so that an electric current may be made to flow uniformly on the wafer surface. Then, porous Si may be formed on the surface of the wafer with a uniform thickness. While, a $P^+$ layer may be formed by ion implantation or epitaxial growth, unlike a diffusion technique, both of these techniques are effective only for treating a side of the wafer and neither of them can be used to form a P+layer on the rear surface simultaneously. Additionally, they are more costly than the diffusion technique although they are good for treating only a side of the wafer. Thus, the diffusion technique is advantageous in that it can treat the both sides simultaneously and the process cost is low.

The epitaxial growth technique, on the other hand, is advantageous over the diffusion technique in that it can effectively minimize the reduction of the height of the first article, smooth the surface with a low defect density and provide a uniform dopant concentration across the height of the film, although the process may be more costly than the diffusion technique.

Thus, as discussed above, according to the invention, the first and second substrates of a multilayer structure can be separated along a porous layer over a large surface area so that the processing steps of grinding, polishing and etching that are used in the conventional processes to scrape the first article and expose the porous layer can be omitted to significantly reduce the total number of steps.

Additionally, if the substrate of the first article is gradually removed by grinding or etching from a side thereof in a process of preparing a multilayer structure, the two sides of the substrate cannot be effectively used to bond it to a supporting substrate. To the contrary, according to the invention, the substrate of the first substrate retains the original profile except the surface layer and, therefore, a pair of multilayer structures may be prepared simultaneously by using the two opposite sides of the substrate of the first article and bonding a pair of supporting substrates to the respective sides of the substrate of the first article. Such a technique will significantly curtail the overall manufacturing time and improve the productivity. It may be needless to say that the substrate of the first article can be reused after separating it from the multilayer structures.

Thus, the present invention provides a method of manufacturing a semiconductor article in a highly economical way by using a single-crystal substrate showing a uniform crystallinity over a wide area and removing the surface layer from a side of the substrate except the Si or compound semiconductor active layer formed on the surface to produce an Si single-crystal layer or a compound semiconductor single-crystal layer on an insulation layer practically without defects.

Additionally, the present invention provides a method of manufacturing a semiconductor article that is outstanding in terms of productivity, uniformity, controllability and cost for preparing an Si or compound semiconductor single-crystal layer showing a crystallinity as good as a single-crystal wafer on a transparent substrate (light-transmitting substrate).

Still additionally, the present invention provides a method of manufacturing a semiconductor article that can replace a costly SOS or SIMOX for preparing an LSI having an SOS structure.

According to the invention, a single-crystal compound semiconductor layer showing a good crystallinity can be formed on a porous Si layer and then transferred onto an insulating substrate having a large surface area that can be provided economically. Thus, a compound semiconductor layer can be formed on an insulating substrate, minimizing the difference in the lattice constant and the thermal expansion coefficient.

A semiconductor substrate that can be used for the purpose of the present invention is a P-type or N-type semiconductor substrate. It may be a silicon substrate having a specified specific resistance or, alternatively, it may be a less costly resistance-non-specified silicon wafer or regenerated wafer (a "regenerated wafer" as used herein refers to a wafer obtained by removing the surface layer of a monitor wafer used in an IC process or a wafer carrying a rejected device on the surface by means of etching or polishing and then polishing the surface to a level of smoothness compatible with an IC process).

According to the invention, the porosity of an outer peripheral area may be reduced while that of a central area may be raised through a combined use of anodization and ion implantation so that the outer peripheral area may be expanded remarkably to increase its volume while the central area may be made less strong and hence may be separated with ease.

(Formation of Doped Layer)

For the purpose of the present invention, the element (dopant) to be added to the silicon substrate to control the conductivity type refers to any of the elements popularly used for the semiconductor process. Table 1 shows some of such elements.

TABLE 1

Element Capable of Controlling the Conductivity Type

| Conductivity type | Element |
| --- | --- |
| n | P, As, Sb |
| p | B |

Techniques that can be used to add an element include diffusion, ion implantation and epitaxial growth. If the diffusion method is used for adding an element, it is preferable from the viewpoint of cost to select a diffusion technique that can thermally diffuse an element capable of controlling the conductivity type into the silicon substrate. Table 2 below shows various diffusion techniques that can be used to thermally diffuse such an element.

TABLE 2

Techniques for Diffusing an Element

| Diffusion technique | Diffusion source | Furnace |
| --- | --- | --- |
| Open tube method | $POCl_3$, BN, $PH_3$ | Diffusion furnace |
| Coating method | Coated glass | Diffusion furnace |
| Use of doped film | Doped oxide (CVDPSG) Doped poly Si | Diffusion furnace |
| Shield tube method | As (solid), $BCl_3$, $PH_3$, capsule | Diffusion furnace |

While a porous layer is formed in the diffusion region according to the invention, a porous layer can be formed more easily in a p-type diffusion region than in an n-type diffusion region. Table 3 shows techniques that can be used for diffusing B (boron), bearing this fact in mind.

TABLE 3

Techniques for Diffusing Boron

| Gaseous source | $B_2H_6$ |
| Liquid source | $BBr_3$ |
| Solid source | $B_2O_3$ |
| Solid phase-solid phase diffusion | CVD film, BSG, spin-coat film |

The techniques listed in Table 3 are designed basically to diffuse the element supplied from the source into the silicon substrate by a heat treatment operation conducted in a furnace.

For example, a diffusion process using a spin-coat film may typically be conducted in a manner as described below.

First, a mixture solution of $B_2O_3$, an organic binder and a solvent is applied uniformly onto a silicon substrate (silicon wafer) by means of a spinner. Then, the applied solution is dried and baked to produce a $B_2O_3$ film on the silicon substrate. Then, the silicon substrate is placed in a furnace as shown in FIG. 3 and heat-treated to drive the boron (B) to diffuse. In FIG. 3, 301 denotes the furnace and 302 denotes a susceptor whereas 100 denotes a silicon substrate coated with a $B_2O_3$ film 150 at one of the opposite sides thereof. The boron (B) can be driven to diffuse into the silicon substrate by heat-treating it at about 900° C. to 1,300° C. in a furnace as shown in FIG. 3. Note that a diffusion layer is formed not only on the above-described side bearing the $B_2O_3$ film but also on the opposite side, using the $B_2O_3$ film formed on the adjacently located silicon substrate(s) as diffusion source.

The diffusion layers formed respectively on the two opposite sides of the silicon substrate operate advantageously to reduce the contact resistance with the HF solution when forming a porous layer by anodization in a subsequent step.

For the purpose of the invention, the concentration of the element capable of controlling the conductivity type that is contained in the produced diffusion region is generally found within a range between $5.0 \times 10^{16}/cm^3$ and $5.0 \times 10^{20}/cm^3$, preferably between $1.0 \times 10^{17}/cm^3$ and $2.0 \times 10^{20}/cm^3$, more preferably between $5.0 \times 10^{17}/cm^3$ and $1.0 \times 10^{20}/cm^3$, although the concentration is preferably selected by taking the step of modifying the surface layer into a porous layer and the characteristics of the epitaxial film to be formed on the porous silicon layer into consideration.

For the purpose of the invention, the thickness of the doped layer refers to the thickness of the portion where the concentration of the added dopant is higher than the concentration of that dopant in the semiconductor substrate before it is doped with the dopant.

When a dopant operating as acceptor relative to an n-type substrate is added, the depth from the surface to the PN junction plane becomes the thickness of this p-type doped layer.

Similarly, when a dopant operating as donor relative to a p-type substrate is added, the depth from the surface to the PN junction plane becomes the thickness of this n-type doped layer.

Figure 4:
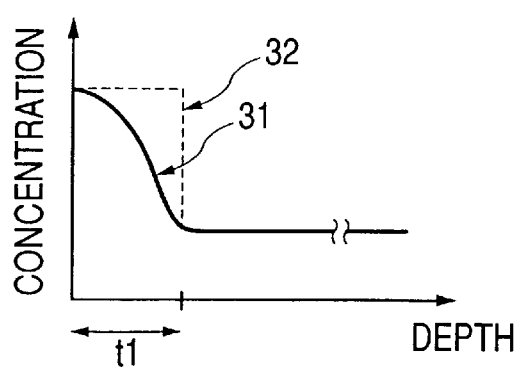
FIG. 4 is a graph showing the concentration distribution pattern of the dopant in the doped layer of a semiconductor article according to the invention.

FIG. 4 shows the concentration profile of a dopant when it is of the same type as that of the substrate, be it p-type or n-type, as obtained as a result of an experiment.

In FIG. 4, the solid curve 31 depicts the dopant profile obtained when a dopant (e.g., B) is added by means of a diffusion technique and the dotted line 32 depicts the dopant profile obtained when a doped layer is formed by epitaxial growth. In FIG. 4, t1 denotes the thickness of the doped layer. As seen in FIG. 4, forming a doped layer by epitaxial growth produces a dopant concentration profile uniform in layer thickness and is therefore preferable for modifying the layer to a porous state. The doped layer should preferably have a depth between 0.2 µm and 30 µm, more preferably between 0.2 µm and 15 µm.

(Formation of Porous Layer)

Techniques that can be used for forming a porous layer for the purpose of the invention will be summarily described below. Porous layers, of Si for example, were discovered by Uhlir et al. in 1956 when they were looking into a process of electrolytically polishing a semiconductor object (A. Uhlir, Bell Syst. Tech. J., vol.35,333 (1956)). Porous Si can be produced by anodizing an Si substrate in an HF solution. Unagami et al. report as a result of researches on the dissolving reaction of Si in anodization that holes are required in an anodic reaction of Si that proceeds in an HF solution and the reaction is expressed by the following formulas (T. Unagami, J. Electrochem. Soc., vol.127,476 (1980)).

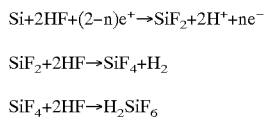

or

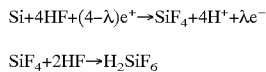

where $e^+$ and $e^-$ represent a hole and an electron respectively and n and λ represent the numbers of holes required to dissolve an Si atom. Porous Si is produced when n>2 or λ>4 is satisfied.

From the above description, it may be said that p-type Si is modified into porous Si in the presence of holes, whereas n-type Si is not modified into porous Si. However, in reality, n-type Si can also be modified to show a porous state. Additionally, semiconductors other than Si such as GaAs can also be modified to show a porous state.

According to the invention, a porous layer showing a monocrystalline property can be produced by anodizing a single-crystal semiconductor substrate typically in an HF solution. A porous layer shows a sponge-like structure, where pores with a diameter between $10^{-1}$ and 10 nm are arranged at intervals also between $10^{-1}$ and 10 nm. While the density of a single-crystal semiconductor substrate is typically 2.33 g/cm$^3$, the density of the porous layer can be modified within a range between 2.1 and 0.6 g/cm$^3$ by changing the concentration of the HF solution between 50 and 20% and/or changing the current density. Thus, the porosity of a porous layer is variable. While the density of a porous layer can be reduced to less than a half of that of a single-crystal semiconductor substrate, the porous layer maintains the monocrystalline property and hence a non-porous single-crystal layer can be formed on the porous layer by epitaxial growth. However, a rearrangement of internal pores takes place to damage the effect of accelerated etching at temperature higher than 1,000° C. Thus, the use of a low temperature growth technique such as molecular beam epitaxial growth, plasma CVD, reduced pressure CVD, photo-assisted CVD, bias sputtering or liquid phase growth is believed to be preferable. However, a high temperature growth technique may also be feasible when a thin protective film is formed on the wall of the pores of the porous layer in advance typically through a low temperature oxidation process.

Since a porous layer contains a large number of voids in the inside, its density is reduced to less than a half of that of a single-crystal semiconductor substrate. In other words, the surface area of the porous layer dramatically increases relative to the volume and hence the rate of chemically etching the porous layer is remarkably enhanced from that of etching an ordinary single-crystal layer.

While the mechanical strength of a porous layer may vary depending on its porosity, it is lower than that of a non-porous layer. For example, a porous layer with a porosity of 50% may show a mechanical strength substantially equal to a half of that of a non-porous layer. Therefore, when a bonded wafer having a porous layer is subjected to compression, tension or shearing force, the porous layer will be destroyed first. A porous layer having a high porosity will be destroyed with small power.

There are reports saying that micro-cavities with a diameter between several nm and tens of several nm are formed in bulk Si to a density of $10^{16}$ to $10^{17}$/cm$^3$ when the bulk Si is heat-treated after implanting helium or hydrogen ions into it. (for example, A. Van Veen, C. C. Griffioen and J. H. Evans, Mat. Res. Soc. Symp. Proc. 107 (1988, Material Res. Soc. Pittsburgh, Pa.) p.449). Recently, researches are being made to utilize such micro-cavities as gettering sites for metal impurities.

For the purpose of the invention, the porous layer is preferably made to show a thickness smaller than its counterpart before forming the porous layer. While there is no limitation to the thickness of the porous layer so long as this requirement is met, it is preferably between 0.1 µm and 29 µm, more preferably between 0.1 µm and 14 µm.

The thickness of the non-porous doped layer left under the porous layer without having been modified into a porous state is preferably between 0.01 µm and 29 µm, more preferably between 0.01 µm and 10 µm.

The porous layer is preferably made to comprise two thin layers having different porosities.

The thin porous layer formed as upper layer in the porous layer that will be located adjacent to a nonporous layer to be formed subsequently is referred to as first porous layer, while the other thin porous layer located under the first porous layer is referred to as second porous layer. Then, the first porous layer preferably has a porosity lower than that of the second porous layer.

Still another porous layer having an intermediary porosity may be arranged between the first and second porous layers.

Alternatively, a third porous layer may be formed adjacently relative to the second porous layer. Then, it is sufficient for the third porous layer to show a porosity different from that of the second porous layer.

A multilayer structure comprising a porous layer can be separated with ease when the first porous layer shows a thickness smaller than the second porous layer.

Since a doped layer formed by epitaxial growth shows a particularly uniform dopant concentration, the use of such a layer is preferable to make the process of forming a plurality of porous layers an easy and satisfactory one.

As described above, a semiconductor article according to the invention allows a subsequently formed non-porous layer to be separated with ease.

A semiconductor article according to the invention can be made to become easily separated by implanting ions of hydrogen, nitrogen or rare gas into at least one of the porous layers.

A semiconductor article according to the invention can be made to become separated along a specific depth in or on the interface of the porous Si layer by implanting ions of at least an element selected from rare gas, hydrogen and nitrogen in advance in such a way that the projection range is located within the porous layer. With such an arrangement, the porous layer left on the second substrate will show a uniform thickness so that it can be removed uniformly by using an etching solution that is not remarkably selective.

(Non-Porous Layer)

For the purpose of the invention a non-porous semiconductor layer may be of a single layer or multilayer structure that can suitably be formed by using at least one selected from single-crystal Si, poly-crystalline Si, amorphous Si or a compound semiconductor selected from GaAs, InP, GaAsP, GaAlAs, InAs, AlGaSb, InGaAs, ZnS, CdSe, CdTe, SiGe and other compound semiconductor materials. The non-porous layer may contain one or more than one semiconductor devices such as FETs (field effect transistors) formed therein in advance.

Alternatively, the non-porous layer may be a metal thin film or a carbon thin film, although not limited thereto. It is not necessary to form such a thin film over the entire surface and the produced thin film may be partly etched.

(First Article)

For the purpose of the invention, a first article comprising a semiconductor substrate having a porous layer and a non-porous layer arranged on said porous layer can be prepared either by forming a non-porous layer on a porous layer formed in a semiconductor substrate or by forming a porous layer in a semiconductor substrate having a non-porous layer.

Techniques that can be used for forming a non-porous semiconductor layer on a porous layer include CVD methods such as reduced pressure CVD, plasma CVD, photo-assisted CVD and MOCVD (metal-organic CVD) and sputtering (including bias sputtering), molecular beam epitaxial growth and liquid phase growth.

(Second Article)

For the purpose of the invention, a second article onto which a non-porous semiconductor layer is to be transferred may be a semiconductor substrate such as a single-crystal silicon substrate, an article obtained by forming an insulation film such as an oxide film (which may be a thermal oxide film) or a nitride film on the surface of a semiconductor substrate, a light transmitting substrate such as a silica glass substrate or a glass substrate, an electrically conductive substrate typically made of metal or an electrically insulating substrate typically made of alumina according to the application of the semiconductor article to be prepared.

(Bonding)

According to the invention, a first article having a porous layer and a non-porous layer is bonded to a second article to produce a multilayer structure in such a way that the non-porous layer is located inside the multilayer structure. For the purpose of the invention, a multilayer structure having a non-porous layer located inside may be a structure obtained by bonding the non-porous layer of a first article directly to a second article or by way of an insulation film such as an oxide film or a nitride film or some other film formed on the non-porous layer. In other words, for the purpose of the invention, a multilayer structure refers to a structure where a non-porous layer is located closer to the second article as viewed from the porous layer.

A first article and a second article may be bonded to each other by holding them in close contact with each other at room temperature if the surfaces to be bonded together of the articles have been smoothed. The bonding strength can be improved by using a technique such as anode coupling, pressure application or heat treatment.

(Separation of Multilayer Structure)

The porous layer that has been produced by modifying a surface layer of a doped layer obtained by adding an element capable of controlling the conductivity type of a diffusion region is brittle and fragile when compared with other regions so that a multilayer structure having such a porous layer can be separated easily and reliably along the porous layer in a separation process.

A multilayer structure can be separated by pulling it in directions perpendicular to the bonding interface, by applying shearing stress to it in a direction parallel to the bonding interface (e.g., by moving the first and second articles in opposite directions parallel to the bonding interface or by rotating them in opposite senses around the center), by applying pressure to it in a direction perpendicular to the bonding interface, by applying wave energy such as ultrasonic waves to the area to be separated, by inserting a separating tool (e.g., a knife having a sharp edge) into the region to be separated from a lateral side of the bonded articles in parallel with the bonding interface, by utilizing the energy of expansion of a substance infiltrated into the porous layer to be separated, by thermally oxidizing the porous layer to be separated and causing it to expand and separate, by selectively etching the porous layer to be separated from a lateral side of the bonded articles or by irradiating a layer that can produce micro-cavities by ion implantation with a laser beam and heating the layer to separate. Alternatively, a multilayer structure can be separated by applying pulsatile heat or thermal stress or by softening the porous layer although it may be separated by means of some other technique.

Now, some of the separating techniques that can feasibly be used for the purpose of the invention will be discussed below.

(Separation by Means of Fluid)

A fluid flow that can be used for separating the porous layer of a multilayer structure for the purpose of the invention can be produced by injecting pressurized fluid (gas or liquid) through a narrow nozzle. A water jet technique as described in "Water Jet", vol.1, p.4 may be used to produce a beam-like high speed jet stream under high pressure. A water jet stream as described above that can suitably be used for the purpose of the invention is produced by applying high pressure (100 $kgf/cm^2$ to 8,000 $kgf/cm^2$) to water by means of a high pressure pump and causing it to flow out as a high speed jet stream through a narrow nozzle, that can be used effectively to cut, process, remove the surface film coat from or clean the surface of various objects made of ceramic, metal, concrete, resin, rubber and/or wood (although a polishing agent may have to be added to water when the object is particularly hard). Conventionally, a water jet stream is used to remove part of an object in a manner as described above. More specifically, a water jet stream is conventionally used to remove a margin to be cut and/or a surface film coat of an object or clean the surface of an object. However, for the purpose of the invention, a jet stream of fluid, which may be water, is made to hit the region to be separated along the bonding line of the bonded articles from a lateral side thereof until the multilayer structure is separated. More specifically, the jet stream is firstly made to directly hit the region to be separated that is exposed at a lateral side of the bonded articles and part of the first and second articles located adjacent to it. Then, only the region to be separated that is mechanically fragile is destroyed by the jet stream of fluid to separate the multilayer structure at that region while the articles are left intact. If the region to be separated is covered by a thin layer and not exposed for some reason or other, such a thin layer can be removed or destroyed by the jet stream to expose the region to be separated, which is then removed by the jet stream.

While not utilized effectively to date, the bonded wafers can be destroyed and separated at the region to be separated by hitting a narrow gap (recess) on a lateral side of the bonded wafers by means of a liquid jet stream so as to push the bonded articles apart along said fragile region. Since no cutting or removal of part of the wafers take place with such a technique, the region to be separated produces practically no debris. Even if the region to be separated is made of a material that cannot be removed by a fluid jet, it can be separated without using a polishing agent and producing damages on the surfaces produced by the separation. Thus, the effect of using a fluid jet is not like the one obtained by cutting or polishing and may be a sort of wedge effect of fluid. Thus, this effect can be expected when the bonded articles show a narrow recess or gap on a lateral side thereof so that a fluid jet stream can exert force on it in directions good for destroying the region to be separated. When this effect can be expected, lateral sides of the bonded articles preferably show not a projecting but a recessed profile.

Figure 5A:
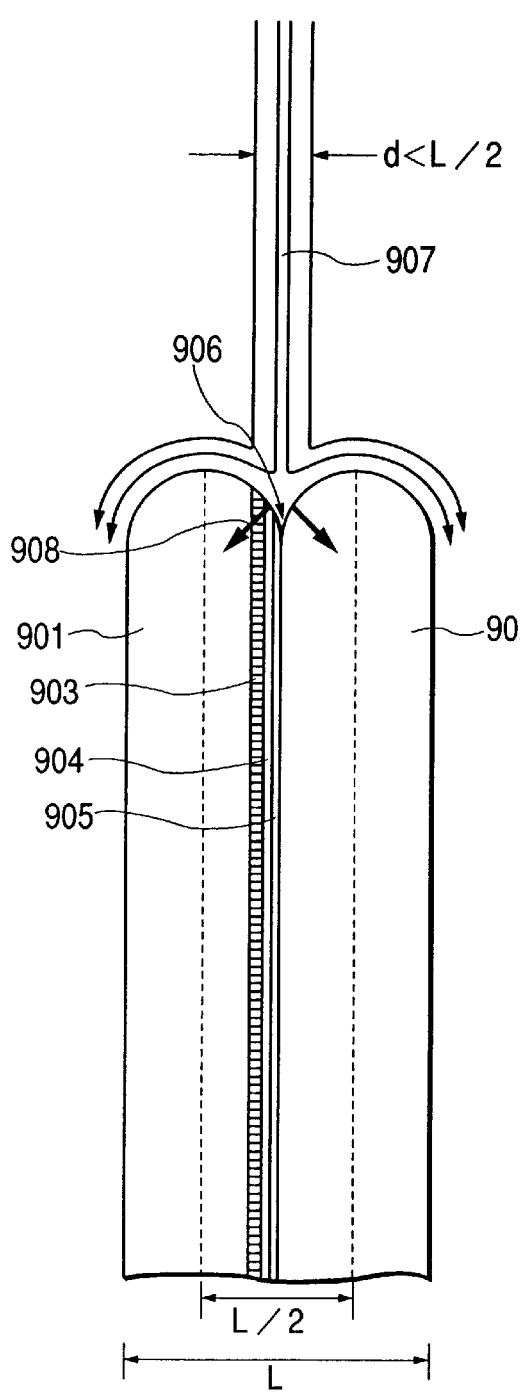
FIGS. 5A and 5B are schematic cross-sectional views of semiconductor articles according to the invention, illustrating different modes of separation.
Figure 5B:
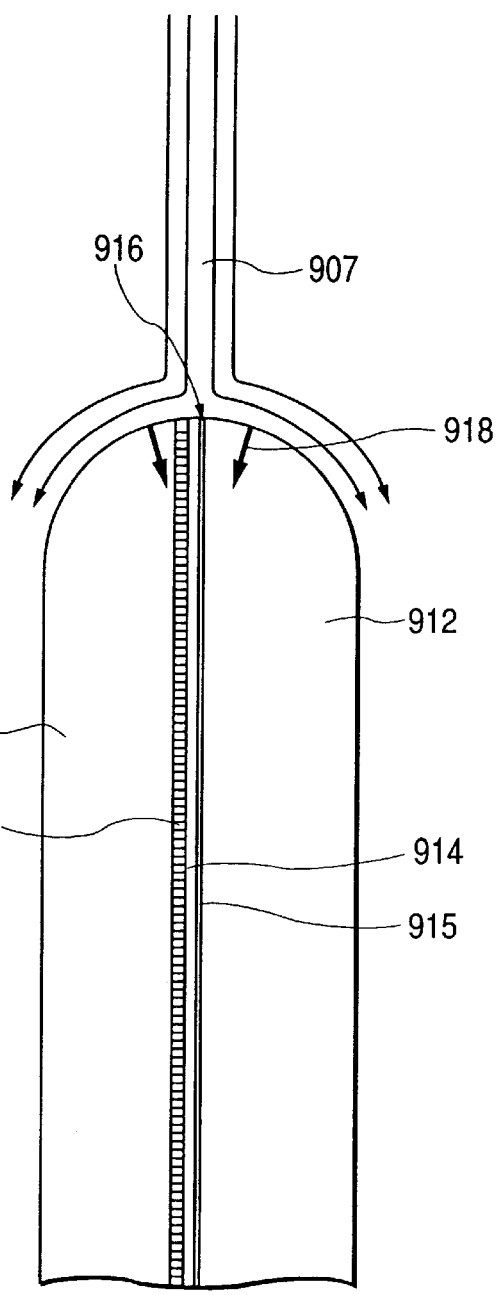

FIGS. 5A and 5B schematically illustrate this effect. In FIGS. 5A and 5B, 901 and 911 denote a first article, 902 and 912 denote a second article and 903 and 913 denote a region to be separated, while 904, 914 denote a semiconductor layer, 905 and 915 denote an insulation layer and 906 and 916 denote a bonding interface. Reference numeral 907 denotes a fluid jet stream and 908 and 918 indicate the directions along which force is applied to the articles.

FIG. 5A shows the directions along which force is exerted onto the bonded articles by a fluid jet stream when the lateral side of the bonded articles shows a recessed profile. Force is exerted in directions good for broadening the recess and hence separating the bonded articles. On the other hand, FIG. 5B shows the directions along which force is exerted onto the bonded articles by a fluid jet stream when the lateral side of the bonded articles shows a projecting profile. Since force is not exerted in directions good for separating the bonded articles, the articles would not be separated unless the region to be separated is destroyed or removed by some other means.

If the region to be separated is covered by a thin layer and not exposed for some reason or other, such a thin layer can be removed or destroyed by the jet stream that exerts force good for broadening the recess to consequently expose the region to be separated, which is then destroyed by the jet stream to successfully separate the articles. In order to receive the fluid jet stream without loss, the recess preferably has an aperture not smaller than the cross-section of the jet stream. In view of the fact that each of the first and second articles to be used for manufacturing a semiconductor article has a thickness not greater than 1.0 mm, typically between 0.7 and 0.8 mm, to make the total thickness not greater than 2.0 mm when bonded and the recess will show a width of about a half of this thickness, the fluid jet stream preferably shows a cross-section with a diameter not greater than 1.0 mm. In actual applications, the use of a fluid jet stream having a diameter of about 0.1 mm will be feasible.

The nozzle through which a fluid jet stream is produced may show a circular cross-section or some other contour. An oblong slit-like nozzle may feasibly be used. A very flat fluid jet stream will be produced from such a nozzle.

The parameters for producing the fluid jet stream may be appropriately selected depending on the type of the region to be separated, the profile of the lateral surface of the bonded wafers to which the jet stream is applied and other factors. The parameters include, above all, the pressure of the jet stream, the scanning speed of the jet stream, the nozzle diameter (substantially equal to the diameter of the fluid jet stream), the profile of the nozzle, the distance between the nozzle and the region to be separated and the flow rate of the fluid.

In the actual separating process, the two wafers can be separated by scanning the nozzle along the bonding interface, hitting the lateral side in a direction parallel to the bonding interface or, alternatively, by moving the bonded articles in parallel with the nozzle, while rigidly and invariably holding the fluid jet stream. Still alternatively, the fluid jet stream may be made to scan to draw a sector extending from a center, which is the nozzle, or, when the bonded articles show a disk-like profile as often is the case, the bonded wafers may be rotated around the center thereof, while also rigidly and invariably holding the fluid jet stream. If necessary, the bonded interface and the nozzle may be arranged at offset positions displaced from a common plane so that the fluid jet stream may hit the region to be separated with a given angle. The mode of scanning the fluid jet stream also may not be limited to the above description. Since the fluid jet stream has a very small cross-section and proceeds in a direction substantially parallel to the surfaces of the bonded wafers, the high pressure of the jet stream that is as high as thousands of several $kgf/cm^2$ will practically not be applied to the wafers as will easily be understood by way of vector analysis. The force exerted on the bonded articles by the fluid jet stream is several g at most so that it cannot destroy the articles.

The fluid to be used for producing a jet stream may not necessarily be water. Fluid materials that can be used for the purpose of the invention include alcohol, organic solvents, acids such as hydrofluoric acid and nitric acid, alkalis such as potassium hydroxide and liquid substances that can selectively etch the region to be separated as well as gaseous substances such as air, nitrogen gas, carbon dioxide gas and rare gases. Gas or plasma that can etch the region to be separated may also be used. When water is used, it is preferably pure water or ultra-pure water from which impurity metals and particles have been almost completely removed if the operation of separating the articles is incorporated into a semiconductor manufacturing process, although ordinary water may be used to produce a water jet for a completely low temperature process and the wafers may be washed completely after the separation.

(Separation by Means of Oxidation)

The porous Si layer may be oxidized from the outer periphery of the wafers by utilizing the phenomenon of enhanced oxidation of porous Si. Then, the porous Si layer expands more along the outer periphery than at the center to produce an effect as if a number of wedges were driven into the porous Si layer evenly and simultaneously along the outer periphery to make only the porous Si layer subjected to internal pressure so that the bonded wafers are broken apart exclusively through the porous Si layer over the entire area. The porous Si layer is normally covered by a non-porous layer even in an outer peripheral area and hence has to be exposed along the outer peripheral area or along the edge before or after the bonding process. When the bonded articles are oxidized, enhanced oxidation starts from an outer peripheral area of the porous Si layer because of the tremendously large surface area of the porous Si layer. As Si is oxidized to become $SiO_2$, its volume is expanded to become 2.27 times greater than before. Thus, the oxidized porous Si layer will continue to expand when the porosity is less than 56%. Oxidation takes place to a lesser degree in a central area, and the expansion of volume of the oxidized porous Si layer will be more remarkable in an outer peripheral area of the wafers. The net result will be the same as the effect produced when a number of wedges are driven into the porous Si layer from the edge evenly and simultaneously to make only the porous Si layer subjected to internal pressure and become separated. Additionally, since oxidation proceeds uniformly along the periphery of the wafers, the latter are separated from each other as separation proceeds evenly from the outer periphery toward the center.

Thus, as a combined effect of enhanced oxidation of the porous Si layer, expansion of the volume of the porous Si layer and the fragility of the porous Si layer, only the porous Si layer can be made to be subjected to internal pressure to separate the bonded wafers in a well-controlled manner by utilizing an operation of oxidation that proceeds highly uniformly and is commonly used in ordinary Si-IC processes.

(Separation by Means of Heating)

For the purpose of the invention, the bonded articles can be separated along the fragile porous Si layer by entirely heating bonded articles to generate thermal stress therein, making use of the fact that the porous Si layer is structurally fragile.

Since the bonded articles show a multilayer structure, they may be separated along part of the interface that is mechanically less strong and/or some other regions that are also mechanically less strong if external pressure is applied thereto to separate the porous Si layer. On the other hand, the bonded articles can be separated successfully along the porous Si layer by heating the porous Si layer with or without some adjacent areas to mollify and/or apply thermal stress to the porous Si layer, making use of the fact that the porous Si layer is structurally fragile.

Alternatively, laser may be used to cause a specific layer of the bonded articles to absorb laser energy and become heated without heating the entire bonded articles. The porous Si layer may be locally heated and separated by irradiating it with a laser beam having a wavelength apt to be absorbed exclusively by the porous Si layer along with or without adjacent layers.

(Separation by Means of Electric Energization)

The porous Si layer can be heated rapidly to generate thermal stress therein and separate it to separate the bonded articles by causing an electric current to flow through the porous Si layer or its vicinity. More specifically, the doped layer is exposed at an end of the wafers by removing $SiO_2$ and the wafers are pinched by a positive electrode and a negative electrode that contact the wafers only at the edge thereof to make an electric current flow along the doped layer in order to separate the wafers.

(Removal of the Porous Layer)

After separating the multilayer structure obtained by bonding first and second articles along the porous layer, the residual porous Si layer, if any, left on the separated semiconductor substrate, which is the second article, can be selectively removed by utilizing the fact that the porous layer is mechanically fragile and has a tremendously large surface area. Methods that can be used for selectively removing the residual porous layer include mechanical ones such as grinding, polishing and lapping, chemical etching using an etching solution, chemical dry etching and ion etching (e.g., reactive ion etching).

Etching solutions that can be used for selectively wet-etching the porous layer include a solution of a mixture of 49% hydrofluoric acid and 30% hydrogen peroxide, a solution of hydrofluoric acid to which alcohol is added, a solution of hydrofluoric acid to which alcohol and hydrogen peroxide are added, a buffered hydrofluoric acid solution with or without alcohol or hydrogen peroxide added thereto, a buffered hydrofluoric acid solution to which alcohol and hydrogen peroxide are added and a solution of a mixture of hydrofluoric acid, nitric acid and acetic acid.

After selectively removing the porous layer, the semiconductor article (SOI substrate) obtained by transferring the non-porous layer onto the second article may be heat-treated in a hydrogen-containing atmosphere to improve the smoothness of the non-porous layer.

Alternatively, particularly when the residual porous layer left on the non-porous layer of the second article is as thin as less than 1pm, the porous layer may be turned into a non-porous state simply by heat treatment (as a method of removing the residual porous layer).

The residual porous layer remaining on the residual doped layer of the semiconductor substrate may be treated like the residual porous layer on the second article to produce a smoothed non-porous surface.

Alternatively, the residual porous layer on the semiconductor substrate and/or the second article can be removed by polishing or lapping.

EMBODIMENT 1

Now, Embodiment 1 of the present invention will be described in detail by referring to FIGS. 1A through 1F. First, a $P^+$ layer 12 is formed on the principal surface of an Si single-crystal substrate 11 by means of a diffusion process or an epitaxial growth process (Step S1, FIG. 1A). Subsequently, the principal surface is modified into a porous state by a depth smaller than the thickness of the $P^+$ layer 12 to produce a $P^+$ porous Si layer 13 (Step S2, FIG. 1B). The rate at which the porous Si layer is formed depends on the $P^+$ concentration of the substrate.

At least a non-porous layer 14 is formed on the $P^+$ porous Si layer 12 to produce a complete first article. The non-porous layer 14 is made of a material selected from single-crystal Si, poly-crystalline Si, amorphous Si, metal film, compound semiconductor thin film and superconductor thin film. It may comprise a device structure of transistors such as MOSFETs. Preferably, $SiO_2$ is formed as outermost layer from the viewpoint that the interface level of the bonding interface can be separated from the active layer. Step S3 is a step for forming an insulation layer 15 of $SiO_2$ as uppermost layer on the surface (FIG. 1C). Then, in Step S4, the surface of the first article is brought into close contact with that of a second article 16 (FIG. 1D). Thereafter, the bonding effect of the two articles may be intensified by anodic bonding or pressure application and, if necessary, heat treatment or a combination of all of them.

When single-crystal Si is deposited, the two articles are preferably bonded together after forming silicon oxide on the surface of the single-crystal Si typically by thermal oxidation. The second article may be selected from an Si substrate, an Si substrate carrying a silicon oxide film formed thereon, a light-transmitting substrate typically made of vitreous silica and a sapphire substrate, although it is not limited thereto and may be any other appropriate article whose surface to be bonded is sufficiently flat and smooth. FIG. 1D shows that the first and second articles are bonded with the insulation layer 15 interposed therebetween, although the insulation layer may be omitted when the non-porous layer 14 is not made of Si or the second article is not an Si substrate.

When bonding, an insulating laminate may be sandwiched between the first and second articles to produce a tripartite structure.

When the non-porous layer is made of epitaxially grown single-crystal silicon or some other material produced by a process involving the use of heat treatment in the epitaxial growth step or in a subsequent step, the internal pores of the porous Si layer can be rearranged and become shut to damage the effect of the operation of etching the porous layer. However, this problem can be avoided by preliminarily heat-treating the porous Si layer typically at temperature between 200° C. and 700° C. to form a thin oxide film on the inner wall of the pores (while maintaining the monocrystallinity of the porous layer) in order to structurally stabilize the porous layer and prevent the possible rearrangement from taking place.

A technique as will be described below can be used to form an epitaxial silicon film with minimal flaws.

While a porous silicon layer maintains a monocrystalline structure, flaws can occur in the epitaxial silicon film due to the innumerable pores on the surface of the porous silicon layer. However, such flaws may be eliminated by covering the uppermost surface of the porous silicon layer with single-crystal silicon.

This can be achieved by heat-treating the porous silicon layer in a hydrogen-containing atmosphere. As a result of the heat treatment using hydrogen, a phenomenon of migration takes pace to some of the silicon atoms on the surface of the porous silicon layer to close the pores of the porous silicon layer exposed to the surface. The heat treatment is conducted at temperature preferably between 500° C. and 1,300° C., more preferably between 900° C. and 1,300° C.

Alternatively, the pores exposed to the surface of the porous silicon layer can be closed by causing source gas containing silicon atoms to flow at a very low rate into a film-forming chamber and produce a silicon film also at a very low rate.

When the outermost pores are closed and an epitaxial silicon film is formed after forming a thin oxide film on the inner wall of the pores, the single-crystal silicon is preferably exposed from the uppermost surface of the porous silicon layer. For the purpose of the invention, the single-crystal silicon can be exposed by dipping the uppermost surface of the porous silicon layer, where a thin oxide film has been formed on the inner wall of the pores, into a solution of an acid such as hydrofluoric acid and removing the thin oxide film formed on the uppermost surface.

Then, the two bonded articles are separated from each other through the inside or the upper or lower surface of the porous silicon layer 13 (Step S5, FIG. 1E) by means of any of the above-listed separating techniques, although some other technique may alternatively be used.

Thereafter, the residual porous silicon layer 13 is selectively removed. When the non-porous layer is made of single-crystal Si, at least one of the solutions including an ordinary etching solution for etching Si, a hydrofluoric acid solution that is used for selectively etching porous silicon, a mixture solution obtained by adding at least alcohol or hydrogen peroxide to hydrofluoric acid, a buffered hydrofluoric acid solution or a mixture solution obtained by adding at least alcohol or hydrogen peroxide to a buffered hydrofluoric acid solution will be selected and only the porous silicon layer 13 will be subjected to non-hydrolytic wet chemical etching, using the selected solution, so that the film formed on the porous layer of the first article may be left on the second article. As discussed in detail above, only the porous silicon can be selectively etched by means of an ordinary etching solution to be used for etching silicon due to the tremendous surface area of the porous silicon layer. Alternatively, the porous silicon layer 13 may be removed by selective polishing, using the non-porous thin film layer 14 as polishing stopper.

When a compound semiconductor layer is formed on the porous silicon layer, only the porous silicon layer 13 will be chemically etched by means of an etching solution showing a higher etching rate relative to Si than to compound semiconductor so that the thin film of the single-crystal compound semiconductor layer 14 may be left on the second article. Alternatively, the porous silicon layer 13 may be removed by selective polishing, using the single-crystal compound semiconductor layer 14 as polishing stopper.

FIG. 1F schematically shows a semiconductor article obtained by a method according to the invention. A non-porous thin film such as a single-crystal Si thin film 14 is formed flatly and uniformly on the second article 16 to cover the entire surface of the wafer and show a large surface area. When an insulator substrate is used for the second article 16, the obtained semiconductor substrate can advantageously be used for preparing insulated and isolated electronic devices.

The residual porous silicon layer is removed from the Si single-crystal substrate 11. The surface reflects the profile of the original porous Si/substrate interface and hence is substantially flat. However, the surface shows a degree of micro-roughness attributable to the fine pores of the porous silicon layer. If the flatness of the surface is not acceptable, the substrate 11 is subjected to a smoothing process before it is reused as an Si single-crystal substrate 11 that becomes a first article or as a second article.

EMBODIMENT 2

This embodiment can be obtained by partly modifying Embodiment 1. This will be described by referring to FIGS. 6A through 6F.

First, a doped layer 12 of Si is made to epitaxially grow on the surface of a semiconductor substrate 11 (Step S1, FIG. 6A).

Then, the doped layer 12 is turned into porous state from the surface to produce a porous silicon layer. Note that at least two porous silicon thin layers 33, 43 having different respective porosities are formed by modifying the conditions for turning the doped layer 12 into a porous state. Preferably, the thin layer 33 that is to be arranged adjacent to a non-porous layer 14 to be formed in a subsequent step shows a porosity lower than that of the other thin layer 43 (Step S2, FIG. 6B).

If necessary, the wall surface of the pores of the porous silicon layer 13 is oxidized at temperature between 200° C. and 700° C.

Also if necessary, the oxide film on the surface of the porous silicon layer 13 is removed and heat-treated in a hydrogen-containing atmosphere at temperature between 500° C. and 1,300° C. Subsequently, a single-crystal semiconductor layer 14 is formed by homo- or hetero-epitaxial growth.

If necessary, an insulation layer is formed on the surface of the non-porous layer 14 (Step S3, FIG. 6C) and then the surface is bonded to the non-porous layer 14 of a second article 16 (Step S4, FIG. 6D).

The obtained multilayer structure is then separated by any of the above-listed techniques (Step S5, FIG. 6). Since the porous layer comprises a plurality of sub-layers 33, 43 having different respective porosities in this embodiment, the separation of the two articles will be easier and the technique of causing a fluid jet stream to hit a lateral side (edge) of the multilayer structure will advantageously be used.

EMBODIMENT 3

This embodiment can be obtained by partly modifying Embodiment 1 or 2.

More specifically, ions of an element selected from hydrogen, nitrogen or rare gas are implanted into or on the upper or lower interface of the porous layer 13 comprising a single layer or a plurality of sub-layers to produce a layer capable of providing micro-bubbles.

The operation of implanting ions may be conducted before or after forming the non-porous layer 14.

After forming a layer capable of providing micro-bubbles by ion implantation, the bubbles grow and the multilayer structure is separated by itself when it is subjected to a heat treatment process.

EMBODIMENT 4

This embodiment is realized by conducting the processing steps described above by referring to Embodiments 1 through 3 on the two opposite sides of a first article, bonding a pair of second articles to the opposite sides of the first article respectively and separating the two second articles from the first article along the respective porous layers to produce a pair of semiconductor articles simultaneously.

The residual porous Si is then removed from the Si single-crystal substrate of the first article. If the flatness of the surfaces is not acceptable, the substrate is subjected to a smoothing process before it is reused as an Si single-crystal substrate that becomes a first article or as a second article.

The two second semiconductor articles may not be made of a same material nor have a same thickness. The non-porous thin films formed on the opposite sides of the first article may not be made of a same material nor have a same thickness.

EXAMPLE 1

A $P^+$ high concentration layer with a boron concentration of $5 \times 10^{17}$ to $1 \times 10^{20}/cm^3$ was formed to a thickness of 10 $\mu$m on the surface of a resistance-non-specified single-crystal Si substrate by means of a diffusion method. The process of forming the $P^+$ high concentration layer using a diffusion method was conducted in a manner as described below. First, a solution obtained by dissolving $B_2O_3$ into a solvent was applied to the principal surface of the Si substrate by means of a spin-coat technique. Then, the solvent was driven off by baking the substrate at 140° C. The obtained substrate was then placed in a diffusion furnace and subjected to a so-called drive-in diffusion process, maintaining the inside of the furnace tube at 1,150° C. for 24 hours to produce the $P^+$ high concentration layer. After removing the coat film, the layer was anodized in an HF solution from the side of the high density surface.

The anodization was conducted under the following conditions.

Current density: 7 (mA·cm$^{-2}$)
Anodizing solution: $HF:H_2O:C_2H_5OH=1:1:1$
Duration: 7 (min.)
Thickness of porous Si layer: 8 $\mu$m The substrate was then oxidized in an oxygen atmosphere at 400° C. for 1 hour. As a result of the oxidation, the inner walls of the pores of the porous Si layer were covered by a thermal oxide film. Then, single-crystal Si was made to epitaxially grow at a rate of 0.3 $\mu$m/min. on the porous Si layer by CVD (chemical vapor deposition) under the following conditions. Since the surface of the porous Si layer was exposed to a high heat treatment temperature of 1,000° C. in 100% hydrogen atmosphere in the initial stages of the epitaxial growth, the pores exposed to the surface were filled to show a flat surface.

Source gas: $SiH_2Cl_2/H_2$
Gas flow rate: 0.5/180 liter/min.
Gas pressure: 80Torr
Temperature: 950° C.
Growth rate: 0.3 $\mu$m/min.

Then, an $SiO_2$ layer was formed on the surface of the epitaxial Si layer by thermal oxidation to produce a finished first article.

Then, the surface of the $SiO_2$ layer was brought into close contact with the surface of another Si substrate (second article) and the two articles were heat-treated at 1,000° C. for 1 hour.

When a water jet having a diameter of 0.2 mm was injected onto a beveled gap along the edge of the bonded wafers, they were separated into two wafers along the porous Si layer.

Subsequently, the residual porous Si layer left on the second article was removed by selective etching, using a mixture solution of 49 Vol % hydrofluoric acid, 30 Vol % hydrogen peroxide and water, which was stirred constantly. The single-crystal Si was left unetched, whereas the porous Si was totally removed by the selective etching, utilizing the single-crystal Si as etching stopper.

The rate R1 of etching non-porous Si single-crystal of the etching solution is very low and the ratio R1/R2 relative to the rate R2 of etching a porous layer is as small as more than $10^{-5}$ so that the effect of etching the non-porous layer and reducing the film thickness thereof (tens of several angstroms) was practically negligible.

Thus, a single-crystal Si layer was formed on the silicon oxide film to a thickness of 0.2 $\mu$m to produce a finished semiconductor article. The film thickness of the formed single-crystal Si layer was observed at 100 points distributed over the entire surface of the article to find that it was as uniform as 201 nm±4 nm.

Additionally, the obtained semiconductor article was heat treated in 100% hydrogen at 1,100° C. for 1 hour. The surface roughness was evaluated through an atomic force microscope to find that the root-mean-square of surface roughness in a 50 $\mu$m square area was about 0.2 nm, which was comparable to that of commercially available Si wafers.

When a cross-section of the semiconductor article was observed through a transmission electron microscope, it was found that no additional crystal defects had been introduced into the Si layer and an excellent crystallinity was maintained.

Similar results were obtained when no oxide film was formed on the epitaxial Si layer. Further, similar results were obtained when an oxide film was formed on the second article.

At the same time, the porous Si left on the single-crystal Si substrate was also removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper. Thus, it was possible to reuse it in a diffusion process to form a P+ high concentration layer as the single-crystal Si substrate of another first article or in a contacting process as another second article.

The micro-roughness on the surface of the single-crystal Si substrate attributable to micro-pores may be removed by heat-treating the substrate in hydrogen at 1,100° C. for 1 hour before reusing it. However, such a smoothing process may not be necessary if the substrate is reused as the Si substrate of another first article because it is subjected to a surface-smoothing process when the pores of the porous Si layer exposed to the surface are sealed during a pre-baking operation conducted in hydrogen in advance to an epitaxial growth process.

The above heat treatment in hydrogen may be replaced by an operation of smoothing the micro-roughness attributable to micro-pores, using a surface touch-polish technique.

The root-mean-square of surface roughness of the Si substrate of the first article was less than 10 nm in a micro-region of a 50 $\mu$m square area and its surface was visually mirror-smooth under fluorescent light over a large area, or over the entire surface of the wafer, after removing the porous layer. For the purpose of comparison, a similar Si substrate was prepared for the first article by following the steps of this example except that a porous layer was formed on a P+ wafer with an impurity concentration of $5\times10^{18}/cm^3$ and no additional doped layer was formed. Then, the root-mean-square of surface roughness of the Si substrate of the first article was less than 10 nm in a micro-region of a 50 $\mu$m square area but undulations were visually observed under fluorescent light over a large area, or over the entire surface of the wafer, after removing the porous layer. FIG. 7 illustrates the observed surfaces of the two specimens.

When the Si substrate of the first article of this example and that of the first article prepared for the purpose of comparison were both subjected to a hydrogen annealing process as described above, after removing the porous layer, the root-mean-square of surface roughness of the Si substrate of the first article of this example was less than 0.2 nm in a micro-region of a 50 $\mu$m square area and its surface was visually mirror-smooth under fluorescent light over a large area, or over the entire surface of the wafer, whereas the root-mean-square of surface roughness of the Si substrate of the first article of the comparative specimen was less than 0.2 nm in a micro-region of a 50 $\mu$m square area but undulations were visually observed under fluorescent light over a large area, or over the entire surface of the wafer. FIGS. 5A and 5B illustrate the observed surfaces of the two specimens.

EXAMPLE 2

A specimen was prepared as in Example 1 except the following anodization conditions were used.

A P+ high concentration layer with a boron concentration of $5\times10^{17}$ to $1\times10^{20}/cm^3$ was formed to a thickness of 10 $\mu$m on the surface of a resistance-non-specified single-crystal Si substrate by means of a diffusion method and subsequently subjected to an anodization process conducted under the following conditions.

First stage
Current density: 7 (mA·cm$^{-2}$)
Anodizing solution: HF:H$_2$O:C$_2$H$_5$OH=1:1:1
Duration: 5 (min.)
Thickness of first porous Si layer: 6 $\mu$m
Second stage
Current density: 30 (mA·cm$^{-2}$)
Anodizing solution: HF:H$_2$O:C$_2$H$_5$OH=1:1:1
Duration: 100 (sec.)
Thickness of second porous Si layer: 3 $\mu$m As a result of using different current densities, the porosity of the first porous Si layer was lower than that of the second porous Si layer.

Then, the substrate was oxidized in an oxygen atmosphere at 400° C. for 1 hour to cover the inner wall of the pores of the porous Si layer with a thermal oxide film. Subsequently, single-crystal Si was made to epitaxially grow at a rate of 0.3 $\mu$m/min. on the porous Si layer by CVD (chemical vapor deposition) under the conditions as described above for Example 1. Then, an SiO$_2$ layer was formed to a thickness of 200 nm on the surface of the epitaxial Si layer by thermal oxidation to produce a finished first article.

Then, the surface of the SiO$_2$ layer was brought into close contact with the surface of another Si substrate (second article) and the two articles were heat-treated at 1,000° C. for 1 hour.

When a water jet having a diameter of 0.2 mm was injected onto a beveled gap along the edge of the bonded wafers, they were separated into two wafers along the porous Si layer.

Subsequently, the residual porous Si layer left on the second article was removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper.

The rate R1 of etching non-porous Si single-crystal of the etching solution is very low and the ratio relative to the rate R2 of etching a porous layer is as small as more than $10^{-5}$ so that the effect of etching the non-porous layer and reducing the film thickness thereof (tens of several angstroms) was practically negligible.

Thus, a single-crystal Si layer was formed on the silicon oxide film to a thickness of 0.2 $\mu$m to produce a finished semiconductor article. The film thickness of the formed single-crystal Si layer was observed at 100 points distributed over the entire surface of the article to find that it was as uniform as 201 nm±4 nm.

Additionally, the obtained semiconductor article was heat treated in hydrogen at 1,100° C. for 1 hour. The surface roughness was evaluated through an atomic force microscope to find that the root-mean-square of surface roughness in a 50 $\mu$m square area was about 0.2 nm, which was comparable to that of commercially available Si wafers.

When a cross-section of the semiconductor article was observed through a transmission electron microscope, it was found that no additional crystal defects had been introduced into the Si layer and an excellent crystallinity was maintained.

Similar results were obtained when no oxide film was formed on the epitaxial Si layer. Further, similar results were obtained when an oxide film was formed on the second article.

At the same time, the porous Si left on the first article was also removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper. Thus, it was possible to reuse it in a diffusion process to form a P+ high concentration layer as the single-crystal Si substrate of another first article or in a contacting process as another second article.

The micro-roughness on the surface of the single-crystal Si substrate attributable to micro-pores may be removed by heat-treating the substrate in hydrogen at 1,100° C. for 1 hour before reusing it. However, such a smoothing process may not be necessary if the substrate is reused as the Si substrate of another first article because it is subjected to a surface-smoothing process when the pores of the porous Si layer exposed to the surface are sealed during a pre-baking operation conducted in hydrogen in advance to an epitaxial growth process.

The above heat treatment in hydrogen may be replaced by an operation of smoothing the micro-roughness attributable to micro-pores, using a surface touch-polish technique.

When the Si substrate of the first article and the Si substrate treated by hydrogen were observed for the surface-roughness both in a micro-region and over a large area after removing the porous Si, results similar to those of Example 1 were obtained.

EXAMPLE 3

The single-crystal Si substrate regenerated in Example 1 was used as a single-crystal Si substrate for preparing a first article and a semiconductor article was produced as in Example 1.

More specifically, after separating the first article from the second article in Example 1, the residual porous Si on the first article was removed by selective etching to obtain a regenerated substrate. The regenerated single-crystal Si substrate was then used to prepare a semiconductor article as in Example 1.

As a result of using a regenerated substrate, the obtained semiconductor article showed a uniformity of film thickness comparable to the semiconductor article obtained by using a new substrate after etching the porous Si and also a root-mean-square of surface roughness in a 50 $\mu$m square area comparable to the semiconductor article of Example 1 after a heat treatment in a hydrogen atmosphere at 1,100° C. for 1 hour. When a cross-section of the semiconductor article was observed through a transmission electron microscope, it was found that no additional crystal defects had been introduced into the Si layer and an excellent crystallinity was maintained.

When the Si substrate of the first article and the Si substrate treated by hydrogen were observed for the surface-roughness both in a micro-region and over a large area after removing the porous Si, results similar to those of Example 1 were obtained.

EXAMPLE 4

A specimen was prepared as in Example 1 except the following anodization conditions were used.

A P$^+$ high concentration layer with a boron concentration of $5\times10^{17}$ to $1\times10^{20}$/cm$^3$ was formed to a thickness of 16 $\mu$m on the surface of a resistance-non-specified single-crystal Si substrate by means of a diffusion method. The process of forming the P$^+$ high concentration layer using a diffusion method was conducted in a manner as described below. First, an Si substrate was placed in a furnace tube and N$_2$ gas was introduced into a liquid diffusing source containing BBr$_3$ for bubbling. Then, the produced gas was introduced into the furnace tube with carrier gas of (N$_2$+O$_2$). A B$_2$O$_3$ layer was formed by keeping the temperature in the furnace tube at 1,050° C. for 64 hours. Thereafter, the substrate was subjected to a so-called drive-in diffusion process, maintaining the inside of the furnace tube at 1,150° C. for 24 hours to produce the P$^+$ high concentration layer.

First stage
Current density: 7 (mA·cm$^{-2}$)
Anodizing solution: HF:H$_2$O:C$_2$H$_5$OH=1:1:1
Duration: 11 (min.)
Thickness of first porous Si layer: 12 $\mu$m
Second stage
Current density: 20 (mA·cm$^{-2}$)
Anodizing solution: HF:H$_2$O:C$_2$H$_5$OH=1:1:1
Duration: 3 (min.)
Thickness of second porous Si layer: 3 $\mu$m As a result of using different current densities, the porosity of the first porous Si layer was lower than that of the second porous Si layer.

A semiconductor article was produced by following the process as described in Example 1. The bonded wafers were then separated into two wafers along the second porous Si layer.

In this example, the film thickness of the formed single-crystal Si layer showed a uniformity of 201 nm±4 nm. The root-mean-square of surface roughness in a 50 $\mu$m square area of the obtained semiconductor article was about 0.2 nm after a heat treatment in a hydrogen atmosphere at 1,100° C. for 1 hour. When a cross-section of the semiconductor article was observed through a transmission electron microscope, it was found that no additional crystal defects had been introduced into the Si layer and an excellent crystallinity was maintained.

When the Si substrate of the first article and the Si substrate treated by hydrogen were observed for the surface-roughness both in a micro-region and over a large area after removing the porous Si, results similar to those of Example 1 were obtained.

EXAMPLE 5

A semiconductor article was prepared as in Example 1 except that the following conditions were used.
1) epitaxial Si layer (thickness): 2.05 $\mu$m
2) thermal oxide film on epitaxial Si layer: 0.1 $\mu$m
3) second article: Si substrate carrying 1.9 $\mu$m SiO$_2$ layer on the surface
4) bonding: The surfaces of two articles were exposed to nitrogen plasma (to improve the bonding strength), put in contact with one another and annealed at 400° C. for 10 hours.

In this example, a single-crystal Si layer was formed to a thickness of about 2 $\mu$m on the silicon oxide film to produce a finished semiconductor article.

The film thickness of the formed single-crystal Si layer showed a uniformity of 2.00 nm+0.04 $\mu$m. The root-mean-square of surface roughness in a 50 $\mu$m square area of the obtained semiconductor article was about 0.2 nm after a heat treatment in a hydrogen atmosphere at 1,100° C. for 1 hour. When a cross-section of the semiconductor article was observed through a transmission electron microscope, it was found that no additional crystal defects had been introduced into the Si layer and an excellent crystallinity was maintained.

When the Si substrate of the first article and the Si substrate treated by hydrogen were observed for the surface-roughness both in a micro-region and over a large area after removing the porous Si, results similar to those of Example 1 were obtained.

EXAMPLE 6

A semiconductor article was prepared as in Example 1 except that the following conditions were used.

1) second article: quartz substrate
2) bonding: The surfaces of two articles were exposed to nitrogen plasma, put in contact with one another and annealed at 200° C. for 24 hours.
3) thermal treatment in hydrogen: The bonded articles were then heat-treated in hydrogen at 900° C. for 2 hours. The surface roughness was evaluated through an atomic force microscope to find that the root-mean-square of surface roughness in a 50 $\mu$m square area of the obtained semiconductor article was about 0.2 nm, which was comparable to commercially available Si wafers.

The film thickness of the formed single-crystal Si layer showed a uniformity of 2.01 nm±0.04 nm, which was same as its counterpart of Example 1. When a cross-section of the semiconductor article was observed through a transmission electron microscope, it was found that no additional crystal defects had been introduced into the Si layer and an excellent crystallinity was maintained.

When the Si substrate of the first article and the Si substrate treated by hydrogen were observed for the surface-roughness both in a micro-region and over a large area after removing the porous Si, results similar to those of Example 1 were obtained.

EXAMPLE 7

A P$^+$ high concentration layer with a boron concentration of $5\times10^{17}$ to $1\times10^{20}/cm^3$ was formed to a thickness of 10 $\mu$m on the surface of a resistance-non-specified single-crystal Si substrate by means of a diffusion method. The process of forming the P$^+$ high concentration layer using a diffusion method was conducted in a manner as described below. First, an Si substrate was placed in a furnace tube and N$_2$ gas was introduced into a liquid diffusing source containing BBr$_3$ for bubbling. Then, the produced gas was introduced into the furnace tube with carrier gas of (N$_2$+O$_2$). A B$_2$O$_3$ layer was formed by keeping the temperature in the furnace tube at 1,050° C. for 64 hours. Thereafter, the substrate was subjected to a so-called drive-in diffusion process, maintaining the inside of the furnace tube at 1,150° C. for 24 hours to produce the P$^+$ high concentration layer. After removing the coat film, the layer was anodized in an HF solution from the side of the high density surface.

Current density: 7 (mA·cm$^{-2}$)
Anodizing solution: HF:H$_2$O:C$_2$H$_5$OH=1:1:1
Duration: 7 (min.)
Thickness of 1st porous Si layer: 8 $\mu$m The substrate was then oxidized in an oxygen atmosphere at 400° C. for 1 hour. As a result of the oxidation, the inner walls of the pores of the porous Si layer were covered by a thermal oxide film. Then, single-crystal GaAs was made to epitaxially grow up to 1 $\mu$m on the porous Si layer by MOCVD (metal organic chemical vapor deposition) under the following conditions.

Source gas: TMG/AsH$_3$/H$_2$
Gas pressure: 80 Torr
Temperature: 700° C.

Thus, a finished first article was prepared. The surface of the GaAs layer was brought into close contact with the surface of another Si substrate (second article).

When a water jet having a diameter of 0.2 mm was injected onto a beveled gap along the edge of the bonded wafers, they were separated into two wafers along the porous Si layer.

Subsequently, the residual porous Si layer left on the second article was removed by etching, using a mixture solution of ethylenediamine+pyrocatechol+water (to a ratio of 17 ml:3 g:8 ml) at 110° C. The single-crystal GaAs was left unetched, whereas the porous Si was totally removed by the selective etching, utilizing the single-crystal GaAs as etching stopper.

The rate of etching non-porous GaAs single-crystal of the etching solution is very low so that the effect of etching the non-porous layer and reducing the film thickness thereof (tens of several angstroms) was practically negligible.

Thus, a single-crystal GaAs layer was formed on the silicon substrate to a thickness of 1 $\mu$m to produce a finished semiconductor article. The film thickness of the formed single-crystal GaAs layer was observed at 100 points distributed over the entire surface of the article to find that it was as uniform as 1 $\mu$m±29.8 nm.

When a cross-section of the semiconductor article was observed through a transmission electron microscope, it was found that no additional crystal defects had been introduced into the GaAs layer and an excellent crystallinity was maintained.

When a Si substrate having an oxide film was used as supporting substrate, a similar GaAs layer was formed on the insulation film.

At the same time, the porous Si left on the first article was also removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper. Thus, it was possible to reuse it in a diffusion process to be conducted on a P$^+$ high concentration layer as the single-crystal Si substrate of another first article or in a bonding process as another second article.

The micro-roughness on the surface of the single-crystal Si substrate attributable to micro-pores may be removed by heat-treating the substrate in hydrogen at 1,100° C. for 1 hour before reusing it. However, such a smoothing process may not be necessary if the substrate is reused as the Si substrate of another first article because it is subjected to a surface-smoothing process when the pores of the porous Si layer exposed to the surface are sealed during a pre-baking operation conducted in hydrogen in advance to an epitaxial growth process.

The above heat treatment in hydrogen may be replaced by an operation of smoothing the micro-roughness attributable to micro-pores, using a surface touch-polish technique.

When the Si substrate of the first article and the Si substrate treated by hydrogen were observed for the surface-roughness both in a micro-region and over a large area after removing the porous Si, results similar to those of Example 1 were obtained.

EXAMPLE 8

A P$^+$ high concentration layer with a boron concentration of $5\times10^{17}$ to $1\times10^{20}/cm^3$ was formed to a thickness of 10 $\mu$m on the surface of a resistance-non-specified single-crystal Si substrate by means of a diffusion method. The process of forming the P$^+$ high concentration layer using a diffusion method was conducted in a manner as described below. First, an Si substrate was placed in a furnace tube and N$_2$ gas was introduced into a liquid diffusing source containing BBr$_3$ for bubbling. The, the produced gas was introduced into the furnace tube with carrier gas of (N$_2$+O$_2$). A B$_2$O$_3$ layer was formed by keeping the temperature in the furnace tube at 1,050° C. for 64 hours. Thereafter, the substrate was subjected to a so-called drive-in diffusion process, maintaining the inside of the furnace tube at 1,150° C. for 24 hours to produce the P+ high concentration layer. After removing the coat film, a P+ high concentration layer was also formed on the rear surface at the same time. The substrate was anodized in an HF solution from the side of the high density front surface.

Current density: 7 (mA·cm$^{-2}$)
Anodizing solution: HF:H$_2$O:C$_2$H$_5$OH=1:1:1
Duration: 7 (min.)
Thickness of 1st porous Si layer: 8 $\mu$m The substrate was then oxidized in an oxygen atmosphere at 400° C. for 1 hour. As a result of the oxidation, the inner walls of the pores of the porous Si layer were covered by a thermal oxide film. Then, single-crystal InP was made to epitaxially grow up to 1 $\mu$m on the porous Si layer by MOCVD (metal organic chemical vapor deposition).

The surface of the InP layer was brought into close contact with the surface of another quartz substrate (second article) and annealed at 200° C. for 10 hours.

When a water jet having a diameter of 0.2 mm was injected onto a beveled gap along the edge of the bonded wafers, they were separated into two wafers along the porous Si layer.

Subsequently, the residual porous Si layer left on the second article was removed by etching, using a mixture solution of 49% hydrofluoric acid, 30% hydrogen peroxide and water, which was stirred constantly. The single-crystal InP was left unetched, whereas the porous Si was totally removed by the selective etching, utilizing the single-crystal InP as etching stopper.

The rate of etching non-porous InP single-crystal of the etching solution is very low so that the effect of etching the non-porous layer and reducing the film thickness thereof (tens of several angstroms) was practically negligible. Thus, a single-crystal InP layer was formed on the quartz substrate to a thickness of 1 $\mu$m to produce a finished semiconductor article. The film thickness of the formed single-crystal InP layer was observed at 100 points distributed over the entire surface of the article to find that it was as uniform as 1 $\mu$m±29.8 nm.

When a cross-section of the semiconductor article was observed through a transmission electron microscope, it was found that no additional crystal defects had been introduced into the InP layer and an excellent crystallinity was maintained.

At the same time, the porous Si left on the first article was also removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper. Thus, it was possible to reuse it in a diffusion process to be conducted on a P+ high concentration layer as the single-crystal Si substrate of another first article.

The micro-roughness on the surface of the single-crystal Si substrate attributable to micro-pores may be removed by heat-treating the substrate in hydrogen at 1,100° C. for 1 hour before reusing it. However, such a smoothing process may not be necessary if the substrate is reused as the Si substrate of another first article because it is subjected to a surface-smoothing process when the pores of the porous Si layer exposed to the surface are sealed during a pre-baking operation conducted in hydrogen in advance to an epitaxial growth process.

The above heat treatment in hydrogen may be replaced by an operation of smoothing the micro-roughness attributable to micro-pores, using a surface touch-polish technique.

When the Si substrate of the first article and the Si substrate treated by hydrogen were observed for the surface-roughness both in a micro-region and over a large area after removing the porous Si, results similar to those of Example 1 were obtained.

EXAMPLE 9

In this example, the both sides of a single-crystal Si substrate were subjected to a process the same as the one conducted on a side of a single-crystal Si substrate in Example 1 to prepare a first article, and a pair of second articles were bonded to the respective sides of the first article, which was then separated along the respective porous layers to produce a pair of semiconductor articles simultaneously.

Each of the obtained semiconductor articles showed a uniformity of film thickness comparable to the semiconductor article obtained in Example 1 after etching the porous Si and also a root-mean-square of surface roughness in a 50 $\mu$m square area comparable to the semiconductor article of Example 1 after a heat treatment in a hydrogen atmosphere at 1,100° C. for 1 hour. When a cross-section of the semiconductor article was observed through a transmission electron microscope, it was found that no additional crystal defects had been introduced into the Si layer and an excellent crystallinity was maintained.

When the Si substrate of the first article and the Si substrate treated by hydrogen were observed for the surface-roughness both in a micro-region and over a large area after removing the porous Si, results similar to those of Example 1 were obtained.

EXAMPLE 10

A P+ high concentration epitaxial Si layer with a boron concentration of $5\times10^{18}$/cm$^3$ was formed to a thickness of 10 $\mu$m on the surface of a resistance-non-specified single-crystal Si substrate under the following conditions.

Gas: SiH$_2$Cl$_2$/B$_2$H$_6$/H$_2$
Temperature: 1,150° C.
Pressure: 760 Torr
Growth rate: 1 $\mu$m/min.

Subsequently, the substrate was anodized in an HF solution from the side of the high density front surface surface.

Current density: 7 (mA·cm$^{-2}$)
Anodizing solution: HF:H$_2$O:C$_2$H$_5$OH=1:1:1
Duration: 7 (min.)
Thickness of 1st porous Si layer: 8 $\mu$m The substrate was then oxidized in an oxygen atmosphere at 400° C. for 1 hour. As a result of the oxidation, the inner walls of the pores of the porous Si layer were covered by a thermal oxide film. Then, single-crystal Si was made to epitaxially grow at a rate of 0.3 $\mu$m/min. on the porous Si layer by CVD (chemical vapor deposition) under the following conditions. Prior to the epitaxial growth process, the surface of the porous Si layer was heat-treated in 100% H$_2$ at 1,080° C. to fill the pores on the surface and produce a smooth surface.

Source gas: SiH$_2$Cl$_2$/H$_2$
Gas flow rate: 0.5/180 liter/min.
Gas pressure: 80 Torr
Temperature: 950° C.
Growth rate: 0.3 $\mu$m/min.

Then, an SiO$_2$ layer was formed on the surface of the epitaxially grown Si layer by thermal oxidation to produce a finished first article. Then, the surface of the SiO$_2$ layer was brought into close contact with the surface of another Si substrate (second article), and the two articles were heat-treated at 1,000° C. for 1 hour.

When a water jet having a diameter of 0.2 mm was injected onto a beveled gap along the edge of the bonded wafers, they were separated into two wafers along the porous Si layer.

Subsequently, the residual porous Si layer left on the second article was removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper.

The rate R1 of etching non-porous Si single-crystal of the etching solution is very low and the ratio relative to the rate R2 of etching a porous layer is as small as more than $10^{-5}$ so that the effect of etching the non-porous layer and reducing the film thickness thereof (tens of several angstroms) was practically negligible.

Thus, a single-crystal Si layer was formed on the silicon oxide film to a thickness of 0.2 $\mu$m to produce a finished semiconductor article. The film thickness of the formed single-crystal Si layer was observed at 100 points distributed over the entire surface of the article to find that it was as uniform as 201 nm±4 nm.

Additionally, the obtained semiconductor article was heat treated in hydrogen at 1,100° C. for 1 hour. The surface roughness was evaluated through an atomic force microscope to find that the root-mean-square of surface roughness in a 50 $\mu$m square area was about 0.2 nm, which was comparable to that of commercially available Si wafers.

When a cross-section of the semiconductor article was observed through a transmission electron microscope, it was found that no additional crystal defects had been introduced into the Si layer and an excellent crystallinity was maintained.

Similar results were obtained when no oxide film was formed on the epitaxial Si layer. Further, similar results were obtained when an oxide film was formed on the second article.

At the same time, the porous Si left on the first article was also removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper. Thus, it was possible to reuse it in an epitaxial growth process to form on a P$^+$ high concentration layer as the single-crystal Si substrate of another first article or in a bonding process as another second article.

The micro-roughness on the surface of the single-crystal Si substrate attributable to micro-pores may be removed by heat-treating the substrate in hydrogen at 1,100° C. for 1 hour before reusing it. However, such a smoothing process may not be necessary if the substrate is reused as the Si substrate of another first article because it is subjected to a surface-smoothing process when the pores of the porous Si layer exposed to the surface are sealed during a pre-baking operation conducted in hydrogen in advance to an epitaxial growth process.

The above heat treatment in hydrogen may be replaced by an operation of smoothing the micro-roughness attributable to micro-pores, using a surface touch-polish technique.

When the Si substrate of the first article and the Si substrate treated by hydrogen were observed for the surface-roughness both in a micro-region and over a large area after removing the porous Si, results similar to those of Example 1 were obtained.

EXAMPLE 11

An SiO$_2$ layer was formed on the surface of a resistance-non-specified single-crystal Si substrate. The SiO$_2$ layer was used as a surface protector film in the subsequent ion implantation process for preventing any possible surface roughness from taking place. Then, B$^+$ ions were implanted by in an ion implantation process conducted under the following conditions.

Energy: 200 keV

Dose: $1 \times 10^{16}$ cm$^{-2}$

The substrate was then heat-treated at 1,150° C. for 24 hours to heal the damages caused by the ion implantation and diffuse boron ions. As a result, a doped layer was formed to a thickness of 10 $\mu$m on the surface of substrate with boron concentration of 5×10/cm$^3$. After removing the surface SiO$_2$ layer, the substrate was anodized in an HF solution from the side of the high density front surface under the following anodizing conditions.

Current density: 7 (mA·cm$^{-2}$)

Anodizing solution: HF:H$_2$O:C$_2$H$_5$OH=1:1:1

Duration: 7 (min.)

Thickness of 1st porous Si layer: 8 $\mu$m

The substrate was then oxidized in an oxygen atmosphere at 400° C. for 1 hour. As a result of the oxidation, the inner walls of the pores of the porous Si layer were covered by a thermal oxide film. Then, single-crystal Si was made to epitaxially grow at a rate of 0.3 $\mu$m/min. on the porous Si layer by CVD (chemical vapor deposition) under the following conditions. As the surface of the porous Si layer was exposed to H$_2$ in a pre-epitaxial growth step, the pores on the surface were filled to produce a smooth surface.

Source gas: SiH$_2$Cl$_2$/H$_2$

Gas flow rate: 0.5/180 liter/min.

Gas pressure: 80 Torr

Temperature: 950° C.

Growth rate: 0.3 $\mu$m/min.

Then, an SiO$_2$ layer was formed on the surface of the epitaxially grown Si layer by thermal oxidation to produce a finished first article.

Then, the surface of the SiO$_2$ layer was brought into close contact with the surface of another Si substrate (second article) and the two articles were heat-treated at 1,000° C. for 1 hour.

When a water jet having a diameter of 0.2 mm was injected onto a beveled gap along the edge of the bonded wafers, they were separated into two wafers along the porous Si layer.

Subsequently, the residual porous Si layer left on the second article was removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper.

The rate R1 of etching non-porous Si single-crystal of the etching solution is very low and the ratio relative to the rate R2 of etching a porous layer is as small as more than $10^{-5}$ so that the effect of etching the non-porous layer and reducing the film thickness thereof (tens of several angstroms) was practically negligible.

Thus, a single-crystal Si layer was formed on the silicon oxide film to a thickness of 0.2 $\mu$m to produce a finished semiconductor article. The film thickness of the formed single-crystal Si layer was observed at 100 points distributed over the entire surface of the article to find that it was as uniform as 201 nm±4 nm.

Additionally, the obtained semiconductor article was heat treated in hydrogen at 1,100° C. for 1 hour. The surface roughness was evaluated through an atomic force microscope to find that the root-mean-square of surface roughness in a 50 µm square area was about 0.2 nm, which was comparable to that of commercially available Si wafers.

When a cross-section of the semiconductor article was observed through a transmission electron microscope, it was found that no additional crystal defects had been introduced into the Si layer and an excellent crystallinity was maintained.

Similar results were obtained when no oxide film was formed on the epitaxial Si layer. Further, similar results were obtained when an oxide film was formed on the second article.

At the same time, the porous Si left on the first article was also removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the single-crystal Si as etching stopper. Thus, it was possible to reuse it in an implantation process to form a $P^+$ high concentration layer as the single-crystal Si substrate of another first article or in a bonding process as another second article.

The micro-roughness on the surface of the single-crystal Si substrate attributable to micro-pores may be removed by heat-treating the substrate in hydrogen at 1,100° C. for 1 hour before reusing it. However, such a smoothing process may not be necessary if the substrate is reused as the Si substrate of another first article because it is subjected to a surface-smoothing process when the pores of the porous Si layer exposed to the surface are sealed during a pre-baking operation conducted in hydrogen in advance to an epitaxial growth process.

The above heat treatment in hydrogen may be replaced by an operation of smoothing the micro-roughness attributable to micro-pores, using a surface touch-polish technique.

When the Si substrate of the first article and the Si substrate treated by hydrogen were observed for the surface-roughness both in a micro-region and over a large area after removing the porous Si, results similar to those of Example 1 were obtained.

For each of the above examples, the CVD process used for the epitaxial growth can be replaced by MBE, sputtering, liquid phase growth or some other appropriate technique. Additionally, the solution used for selectively etching the porous Si is not limited to a mixture solution of 49% hydrofluoric acid, 30% hydrogen peroxide and water as described above and it may be replaced by hydrofluoric acid, a solution of hydrofluoric acid to which alcohol is added, a solution of hydrofluoric acid to which alcohol and hydrogen peroxide are added, a buffered hydrofluoric acid solution with or without alcohol or hydrogen peroxide added thereto, a buffered hydrofluoric acid solution to which alcohol and hydrogen peroxide are added or a solution of a mixture of hydrofluoric acid, nitric acid and acetic acid because of the tremendously large pore surface area of the porous Si layer.

Additionally, the use of a water jet stream in the above examples for separating bonded articles may be replaced by a mechanical process using compression, tension or shearing force, a process of expanding the porous Si layer from the periphery by oxidation and applying internal pressure to the porous Si layer, a process of pulsatively heating the porous Si layer and applying thermal stress to the porous Si layer or a process of softening the porous Si layer. For separating the wafers by oxidation, thermal oxidation at 1,000° C. is feasible. For separating the wafers by heat, irradiation of $CO_2$ laser pulse with an output level of 500 to 1,000 W will be recommended. As for separating the wafers by an electric current, a pulse current of 10 to 100 A may preferably be used.

For the purpose of the invention, any of the other steps may be modified appropriately without departing from the scope of the invention.

EXAMPLE 12

A $P^+$ layer was formed to a thickness of 10 µm by epitaxial growth with a boron concentration of $5 \times 10^{18}/cm^3$ on the surface of a p-type single-crystal Si substrate under the following epitaxial growth conditions.

Source gas: $SiHCl_3/H_2/B_2H_6$
Gas flow rate: 10 g/min./45 slm/60 sccm(1%)
Gas pressure: 760 Torr
Temperature: 1,100° C.
Growth rate: 3.3 µm/min.

Then, the substrate was subsequently subjected to an anodization process conducted under the following anodizing conditions to produce a porous layer comprising two thin layers having different porosities.

First stage
Current density: 7 (mA·cm$^{-2}$)
Anodizing solution: $HF:H_2O:C_2H_5OH=1:1:1$
Duration: 5 (min.)
Thickness of first porous Si layer: 6 µm
Second stage
Current density: 30 (mA·cm$^{-2}$)
Anodizing solution: $HF:H_2O:C_2H_5OH=1:1:1$
Duration: 100 (sec.)
Thickness of second porous Si layer: 3 µm As a result of using different current densities, the porosity of the first porous Si layer was lower than that of the second porous Si layer.

Then, the substrate was oxidized in an oxygen atmosphere at 400° C. for 1 hour to cover the inner wall of the pores of the porous Si layer with a thermal oxide film. Subsequently, after removing the thermal oxide film from the surface of the porous layer by means of an HF solution, single-crystal Si was made to epitaxially grow at a rate of 0.3 µm/min. on the porous Si layer by CVD under the conditions as described below. As the surface of the porous Si layer was heat-treated at 1,000° C., the pores of the surface were filled to produce a smooth surface.

Source gas: $SiH_2Cl_2/H_2$
Gas flow rate: 0.5/180 liter/min.
Gas pressure: 80 Torr
Temperature: 950° C.
Growth rate: 0.3 µm/min.

Then, an $SiO_2$ layer was formed to a thickness of 200 nm on the surface of the epitaxial Si layer by thermal oxidation to produce a finished first article.

Then, the surface of the $SiO_2$ layer was brought into close contact with the Si surface of another Si substrate (second article), and the two articles were heat-treated at 1,000° C. for 1 hour.

When a water jet having a diameter of 0.2 mm was injected onto a beveled gap along the edge of the bonded wafers, they were separated into two wafers along the porous Si layer having the higher porosity.

Subsequently, the residual porous Si layer having the lower porosity and left on the second article was removed by selective etching, using a mixture solution of 49% hydrofluoric acid, 30% hydrogen peroxide and water, which was stirred constantly. The transferred single-crystal Si was left unetched, whereas the porous Si was totally removed by the selective etching, utilizing the single-crystal Si layer as etching stopper.

Thus, a single-crystal Si layer was formed on the silicon dioxide film to a thickness of 0.2 $\mu$m to produce a finished semiconductor article. The film thickness of the formed single-crystal Si layer was observed at 100 points distributed over the entire surface of the article to find that it was as uniform as 201 nm±4 nm.

Additionally, the obtained semiconductor article was heat treated in 100% hydrogen at 1,100° C. for 1 hour. The surface roughness was evaluated through an atomic force microscope to find that the root-mean-square of surface roughness in a 50 $\mu$m square area was about 0.2 nm, which was comparable to that of commercially available Si wafers.

When a cross-section of the semiconductor article was observed through a transmission electron microscope, it was found that no additional crystal defects had been introduced into the Si layer and an excellent crystallinity was maintained.

At the same time, the porous Si having the higher porosity and left on the single-crystal Si substrate was also removed by selective etching, using a mixture solution of 49% hydrofluoric acid, 30% hydrogen peroxide and water, which was stirred constantly. The single-crystal Si was left unetched, whereas the porous Si was totally removed by the selective etching, utilizing the epitaxially grown $P^+$ type doped layer as etching stopper.

As the P type single-crystal Si substrate carried thereon the epitaxially grown $P^+$ type doped layer that had not been turned to a porous state and was about 1 $\mu$m thick, it was subjected to another epitaxial growth process under the same conditions to produce an additional $P^+$ type layer (boron concentration: $5\times10^{18}/cm^3$) to a thickness of about 9 $\mu$m to make the total thickness of the overall $P^+$ layer on the $P^+$ type single-crystal Si substrate 10 $\mu$m, which was same as the thickness of the first $P^+$ layer. Thus, by repeating a same process, a second SOI wafer was obtained.

As for the surface roughness of the residual $P^+$ layer on the first Si substrate after removing the porous layer was less than 10 nm in a micro-region of a 50 $\mu$m square area and the surface was visually mirror-smooth under fluorescent light over a large area, or the entire surface area of the wafer.

EXAMPLE 13

A semiconductor article was prepared as in Example 12 except the following anodizing conditions were used.

A $P^+$ layer was formed to a thickness of 16 $\mu$m by epitaxial growth with a boron concentration of $5\times10^{18}/cm^3$ on the surface of a P type single-crystal Si substrate as in Example 12.

First stage
Current density: 7 (mA·cm$^{-2}$)
Anodizing solution: HF:H$_2$O:C$_2$H$_5$OH=1:1:1
Duration: 11 (min.)
Thickness of first porous Si layer: 12 $\mu$m
Second stage
Current density: 20 (mA·cm$^{-2}$)
Anodizing solution: HF:H$_2$O:C$_2$H$_5$OH=1:1:1
Duration: 3 (min.)
Thickness of second porous Si layer: 3 $\mu$m As a result of using different current densities, the porosity of the first porous Si layer was lower than that of the second porous Si layer.

Subsequently, a semiconductor article was prepared by way of epitaxial growth, bonding and separation as in Example 12.

The film thickness of the single-crystal Si layer obtained in this example was found to be as uniform as 201 nm±4 $\mu$m after the etching operation. After heat-treating the obtained semiconductor article in hydrogen at 1,100° C. for 1 hour, the surface roughness of the semiconductor article was evaluated to find that the root-mean-square of surface roughness in a 50 $\mu$m square area was about 0.2 nm. When a cross-section of the semiconductor article was observed through a transmission electron microscope, it was found that no additional crystal defects had been introduced into the Si layer and an excellent crystallinity was maintained.

As the P type single-crystal Si substrate carried thereon the epitaxially grown P type doped layer that had not been turned to a porous state and was about 1 $\mu$m thick, it was subjected to another epitaxial growth process under the same conditions to produce an additional $P^+$ type layer (boron concentration: $5\times10^{18}/cm^3$) to a thickness of about 9 $\mu$m to make the total thickness of the overall P layer on the P type single-crystal Si substrate 10 $\mu$m, which was same as the thickness of the first $P^+$ layer. Thus, by repeating a same process, a second SOI wafer was obtained.

As described above in detail, according to the invention, there is provided a method of manufacturing a semiconductor article that is substantially free from undulations on the interface of the porous layer and the substrate and can be separated from a counter substrate reliably with an enhanced degree of reproducibility. With a method according to the invention, semiconductor articles can be manufactured at low cost.

What is claimed is:

1. A method of manufacturing a semiconductor article comprising the steps of forming a doped layer containing an element capable of controlling the conductivity type to the n-type at least on one of the surfaces of a semiconductor substrate, modifying the surface of the doped layer into a porous state to obtain a porous layer thinner than the doped layer, forming a non-porous layer on the porous layer to prepare a first article, bonding said first article and a second article so as to produce a multilayer structure having said non-porous layer in the inside thereof, and separating said multilayer structure along said porous layer.

2. A method of manufacturing a semiconductor article according to claim 1, wherein said element capable of controlling the conductivity type is selected from P, As and Sb.

3. A method of manufacturing a semiconductor article comprising the steps of forming a doped layer by an epitaxial growth process, said doped layer containing an element capable of controlling the conductivity type at least on one of the surfaces of a semiconductor substrate, modifying the surface of the doped layer into a porous state to obtain a porous layer thinner than the doped layer, forming a non-porous layer on the porous layer to prepare a first article, bonding said first article and a second article so as to produce a multilayer structure having said non-porous layer in the inside thereof, and separating said multilayer structure along said porous layer.

4. A method of manufacturing a semiconductor article comprising the steps of forming a doped layer containing an element capable of controlling the conductivity type at least on one of the surfaces of a semiconductor substrate, modifying the surface of the doped layer to form a plurality of porous layers in the doped layer, wherein the plurality of porous layers differ in porosity from each other, and the total thickness of all the porous layers is less than the thickness of the doped layer, forming a non-porous layer on the exposed surface of the porous layer to prepare a first article, bonding said first article and a second article so as to produce a multilayer structure having said non-porous layers in the inside thereof, and separating said multilayer structure along said porous layers.

5. A method of manufacturing a semiconductor article according to claim 3 or 4, further comprising a step of reusing the separated first article as said semiconductor substrate for manufacturing another semiconductor article.

6. A method of manufacturing a semiconductor article according to claim 3 or 4, further comprising a step of reusing the separated first article as said second article for manufacturing another semiconductor article.

7. A method of manufacturing a semiconductor article according to claim 3 or 4, wherein said doped layer and said porous layer are formed on each of the two opposite surfaces of said semiconductor substrate and subsequently said non-porous layer is formed on each of said porous layers.

8. A method of manufacturing a semiconductor article according to claim 3 or 4, wherein said element capable of controlling the conductivity type is capable of controlling the conductivity type of said doped layer to the p-type.

9. A method of manufacturing a semiconductor article according to claim 8, wherein said element capable of controlling the conductivity type is B.

10. A method of manufacturing a semiconductor article according to claim 4, wherein said doped layer is formed by way of a diffusion process.

11. A method of manufacturing a semiconductor article according to claim 10 or 3, wherein said element capable of controlling the conductivity type is supplied by using gas as source.

12. A method of manufacturing a semiconductor article according to claim 10 or 3, wherein said element capable of controlling the conductivity type is supplied by using liquid as source.

13. A method of manufacturing a semiconductor article according to claim 10 or 3, wherein said element capable of controlling the conductivity type is supplied by using solid as source.

14. A method of manufacturing a semiconductor article according to claim 3 or 4, wherein the concentration of said element capable of controlling the conductivity type contained in said doped layer is controlled within a range between $5.0 \times 10^{16}/cm^3$ and $5.0 \times 10^2/cm^3$.

15. A method of manufacturing a semiconductor article according to claim 3 or 4, wherein the concentration of said element capable of controlling the conductivity type contained in said doped layer is controlled within a range between $1.0 \times 10^{17}/cm^3$ and $2.0 \times 10^{20}/cm^3$.

16. A method of manufacturing a semiconductor article according to claim 3 or 4, wherein the concentration of said element capable of controlling the conductivity type contained in said doped layer is controlled within a range between $5.0 \times 10^{17}/cm^3$ and $1.0 \times 10^{20}/cm^3$.

17. A method of manufacturing a semiconductor article according to claim 3 or 4, wherein said multilayer structure is separated by applying external force to said porous layer.

18. A method of manufacturing a semiconductor article according to claim 17, wherein said force is applied by applying pressure to said multilayer structure in a direction perpendicular to its surface, by pulling it in a direction perpendicular to its surface and/or by applying shearing force to it.

19. A method of manufacturing a semiconductor article according to claim 3 or 4, wherein said multilayer structure is separated by exposing the porous silicon at a peripheral edge of said multilayer wherein the concentration of said element capable of controlling the conductivity type contained in said doped layer is controlled within a range between $1.0 \times 10^{17}/cm^3$ and $2.0 \times 10^{20}/cm^3$.

20. A method of manufacturing a semiconductor article according to claim 3 or 4, wherein said multilayer structure is separated by heating said multilayer structure.

21. A method of manufacturing a semiconductor article according to claim 20, wherein said multilayer structure is heated entirely.

22. A method of manufacturing a semiconductor article according to claim 20, wherein said multilayer structure is heated partly.

23. A method of manufacturing a semiconductor article according to claim 22, wherein said multilayer structure is heated by means of laser or an electric current.

24. A method of manufacturing a semiconductor article according to claim 23, wherein said laser is carbon dioxide laser.

25. A method of manufacturing a semiconductor article according to claim 3 or 4, wherein said non-porous layer is a single-crystal silicon layer.

26. A method of manufacturing a semiconductor article according to claim 25, wherein a silicon oxide layer is formed on said single-crystal silicon layer.

27. A method of manufacturing a semiconductor article according to claim 3 or 4, wherein said non-porous layer is a single-crystal compound semiconductor layer.

28. A method of manufacturing a semiconductor article according to any of claims 3 or 4, further comprising a step of removing the residual porous layer remaining on said separated semiconductor substrate and/or said separated second article.

29. A method of manufacturing a semiconductor article according to claim 28, wherein said removal step is a step of etching said residual porous layer.

30. A method of manufacturing a semiconductor article according to claim 28, wherein said removal step is a step of heat-treating said residual porous layer in a hydrogen-containing reducing atmosphere.

31. A method of manufacturing a semiconductor article according to claim 28, wherein said residual porous layer is etched and subsequently said separated semiconductor substrate and/or said separated second article are heat-treated in a hydrogen-containing reducing atmosphere.

32. A method of manufacturing a semiconductor article according to any of claims 3 or 4, wherein the surface of said separated semiconductor substrate 10 and/or that of said separated second article are smoothed.

33. A method of manufacturing a semiconductor article according to claim 28, wherein said removal step is conducted by dipping said residual porous layer in hydrofluoric acid, a solution of hydrofluoric acid to which at least alcohol or hydrogen peroxide is added, buffered hydrofluoric acid or a buffered hydrofluoric acid solution to which at least alcohol or hydrogen peroxide is added.

34. A method of manufacturing a semiconductor article according to claim 28, wherein said removal step is conducted by selectively polishing said porous layer, using said non-porous layer as stopper.

35. A method of manufacturing a semiconductor article according to claim 3 or 4, wherein said bonding step is a step of bringing said articles into close contact with each other.

36. A method of manufacturing a semiconductor article according to claim 3 or 4, wherein said bonding step is conducted by anodic bonding, pressurization, heat treatment or a combination of any of these.

37. A method of manufacturing a semiconductor article comprising the steps of forming a doped layer containing an element capable of controlling the conductivity type at least on one of the surfaces of a semiconductor substrate, modifying the surface of the doped layer into a porous state to obtain a porous layer thinner than the doped layer, forming a non-porous layer on the porous layer to prepare a first article, bonding said first article and a second article so as to produce a multilayer structure having said non-porous layer in the inside thereof, and separating said multilayer structure along said porous layer, wherein said porous layer includes first and second porous thin layers having different porosities and laid one on the other to form a multilayer, of which the first porous thin layer located adjacent to said non-porous layer has a lower porosity.

38. A method of manufacturing a semiconductor article comprising the steps of forming a doped layer, said doped layer comprising an epitaxial layer formed by epitaxial growth and containing an element capable of controlling the conductivity type at least on one of the surfaces of a semiconductor substrate, modifying the surface of the doped layer into a porous state to obtain a porous layer in the epitaxial layer, said porous layer being thinner than the doped layer, forming a non-porous layer on the porous layer to prepare a first article, bonding said first article and a second article so as to produce a multilayer structure having said non-porous layer in the inside thereof, and separating said multilayer structure along said porous layer.

39. A method of manufacturing a semiconductor article according to claim 38, wherein said porous layer comprises a plurality of porous layers having porosities different from each other.

40. A method of manufacturing a semiconductor article according to claim 4 or 39, wherein said multilayer structure is separated in and/or at the interface of the porous layer having the higher porosity.

41. A semiconductor article comprising a semiconductor substrate, a single-crystal semiconductor layer formed on the semiconductor substrate and a porous layer formed on the single-crystal semiconductor layer;

said single-crystal semiconductor layer being a layer formed by epitaxial growth;

said porous layer comprising a plurality of layers having respective porosities different from each other.

42. A semiconductor article according to claim 41, wherein said porous layer is obtained by turning a surface layer of said layer formed by epitaxial growth into a porous state so as to make said porous layer have a thickness smaller than said layer formed by epitaxial growth.

43. A semiconductor article according to claim 41, further comprising a non-porous layer capable of being separated from said semiconductor substrate.

* * * * *

UNITED STATES PATENT AND TRADEMARK OFFICE
CERTIFICATE OF CORRECTION

PATENT NO.    : 6,306,729 B1
DATED         : October 23, 2001
INVENTOR(S)   : Kiyofumi Sakaguchi et al.

It is certified that error appears in the above-identified patent and that said Letters Patent is hereby corrected as shown below:

Column 1,
Line 7, "be" (second occurrence) should be deleted.

Column 2,
Line 41, "form" should read -- from --;
Line 42, "shown" should read -- show --.

Column 3,
Line 2, "growth;" should read -- growth; and --.

Column 5,
Line 24, "Thurs," should read -- Thus, --;
Line 30, "for" should read -- from --.

Column 6,
Line 12, "P+layer" should read -- $P^+$ layer --.

Column 16,
Line 18, "1pm," should read -- $1\mu m$, --.

Column 17,
Line 30, "pace" should read -- place --.

Column 21,
Line 62, "$(mA \cdot cm \cdot ^{-2})$" should read -- $(mA \cdot cm^{-2})$ --.

Column 26,
Line 62, "The," should read -- Then, --.

Column 28,
Line 43, "surface" (first occurrence) should be deleted.

Column 35,
Line 10, "layers" should read -- layer --.

UNITED STATES PATENT AND TRADEMARK OFFICE
CERTIFICATE OF CORRECTION

PATENT NO.   : 6,306,729 B1
DATED        : October 23, 2001
INVENTOR(S)  : Kiyofumi Sakaguchi et al.

It is certified that error appears in the above-identified patent and that said Letters Patent is hereby corrected as shown below:

<u>Column 36,</u>
Lines 9-11, should be deleted.

<u>Column 38,</u>
Line 19, "growth;" should read -- growth; and --.

Signed and Sealed this

Eighth Day of April, 2003

JAMES E. ROGAN
*Director of the United States Patent and Trademark Office*